United States Patent
Choi et al.

(10) Patent No.: US 9,712,357 B2
(45) Date of Patent: Jul. 18, 2017

(54) METHOD FOR TRANSMITTING BROADCASTING SIGNAL, METHOD FOR RECEIVING BROADCASTING SIGNAL, APPARATUS FOR TRANSMITTING BROADCASTING SIGNAL, AND APPARATUS FOR RECEIVING BROADCASTING SIGNAL

(71) Applicant: LG ELECTRONICS INC., Seoul (KR)

(72) Inventors: Jinyong Choi, Seoul (KR); Sangchul Moon, Seoul (KR); Sungryong Hong, Seoul (KR); Woosuk Ko, Seoul (KR); Chulkyu Mun, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/902,830

(22) PCT Filed: Jul. 1, 2014

(86) PCT No.: PCT/KR2014/005835
§ 371 (c)(1),
(2) Date: Jan. 4, 2016

(87) PCT Pub. No.: WO2015/005604
PCT Pub. Date: Jan. 15, 2015

(65) Prior Publication Data
US 2016/0204967 A1    Jul. 14, 2016

Related U.S. Application Data

(60) Provisional application No. 61/843,860, filed on Jul. 8, 2013.

(51) Int. Cl.
*H04L 27/36* (2006.01)
*H04L 27/26* (2006.01)
(Continued)

(52) U.S. Cl.
CPC ..... *H04L 27/2602* (2013.01); *H03M 13/1102* (2013.01); *H03M 13/1111* (2013.01);
(Continued)

(58) Field of Classification Search
CPC .................................................. H04L 27/2602
(Continued)

(56) References Cited

U.S. PATENT DOCUMENTS 9,276,687 B1 * 3/2016 Jeong .................. H04B 7/0413
2008/0260068 A1   10/2008 Seyedi-Esfahani
(Continued)

FOREIGN PATENT DOCUMENTS

KR    10-2013-0030058 A    3/2013

*Primary Examiner* — Lihong Yu
(74) *Attorney, Agent, or Firm* — Birch, Stewart, Kolasch & Birch, LLP

(57) ABSTRACT

The present invention provides a method for transmitting a broadcasting signal. The method for transmitting the broadcasting signal according to the present invention comprises the steps of: encoding data of a plurality of PLPs according to a code rate, wherein the step of encoding data of a plurality of PLPs comprises the steps of LDPC-encoding data of at least one PLP of the plurality of PLPs according to the code rate, bit-interleaving the LDPC-encoded data, and mapping the bit-interleaved data to constellation; mapping the encoded data of the plurality of PLPs to generate at least one signal frame; and modulating data of the generated signal frame through an OFDM scheme and transmitting a broadcasting signal including the modulated data of the signal frame.

8 Claims, 26 Drawing Sheets

(51) Int. Cl.

| | | |
|---|---|---|
| *H04N 21/2383* | (2011.01) | |
| *H03M 13/27* | (2006.01) | |
| *H04L 5/00* | (2006.01) | |
| *H04L 27/38* | (2006.01) | |
| *H04H 60/00* | (2009.01) | |
| *H04L 27/00* | (2006.01) | |
| *H03M 13/11* | (2006.01) | |
| *H03M 13/25* | (2006.01) | |
| *H03M 13/29* | (2006.01) | |
| *H03M 13/00* | (2006.01) | |
| *H03M 13/09* | (2006.01) | |
| *H03M 13/15* | (2006.01) | |
| *H04H 60/73* | (2008.01) | |

(52) U.S. Cl.
CPC ......... *H03M 13/255* (2013.01); *H03M 13/27* (2013.01); *H03M 13/2778* (2013.01); *H03M 13/2906* (2013.01); *H03M 13/6356* (2013.01); *H04H 60/00* (2013.01); *H04L 5/00* (2013.01); *H04L 5/0007* (2013.01); *H04L 27/00* (2013.01); *H04L 27/36* (2013.01); *H04L 27/38* (2013.01); *H04N 21/2383* (2013.01); *H03M 13/09* (2013.01); *H03M 13/152* (2013.01); *H04H 60/73* (2013.01)

(58) Field of Classification Search
USPC .......................................................... 375/298
See application file for complete search history.

(56) References Cited

U.S. PATENT DOCUMENTS

| | | | |
|---|---|---|---|
| 2009/0285332 A1 | 11/2009 | Damen et al. | |
| 2011/0044407 A1 | 2/2011 | Chang et al. | |
| 2011/0096814 A1* | 4/2011 | Wu ................... | H04L 27/2604 375/219 |
| 2012/0314786 A1* | 12/2012 | Atungsiri ............ | H04L 27/3488 375/260 |
| 2012/0327879 A1 | 12/2012 | Stadelmeier et al. | |
| 2013/0064313 A1* | 3/2013 | Gatti ................... | H04L 25/0204 375/260 |
| 2013/0070813 A1 | 3/2013 | Kim et al. | |

* cited by examiner

FIG. 19
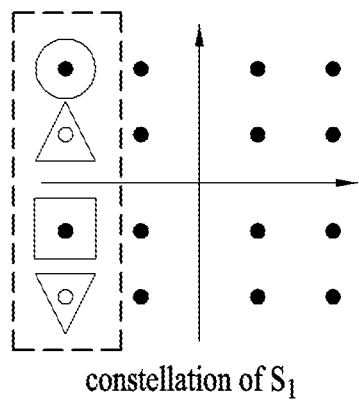
constellation of $S_1$
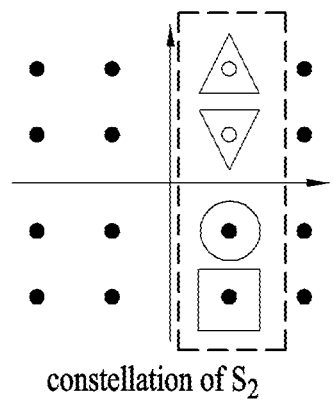
constellation of $S_2$
(a)
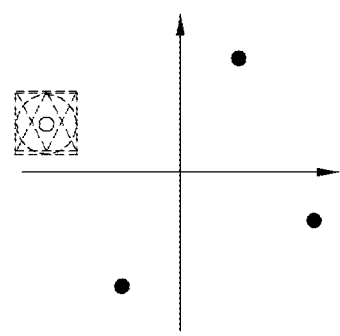
constellation of $r_1$
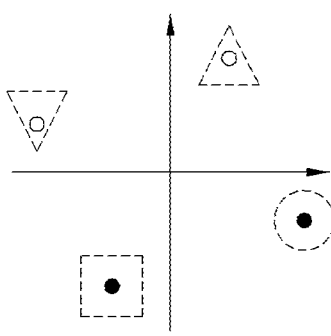
constellation of $r_2$
(b)

FIG. 21
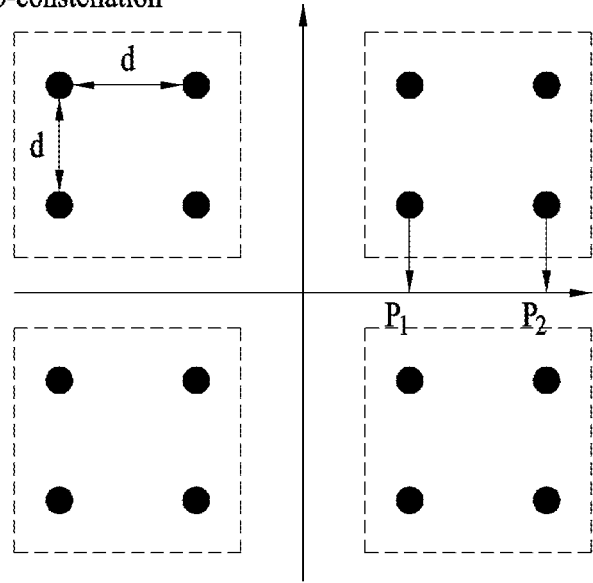
(a)
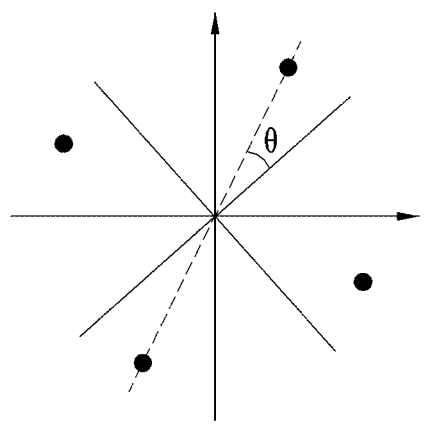
(b)

FIG. 23
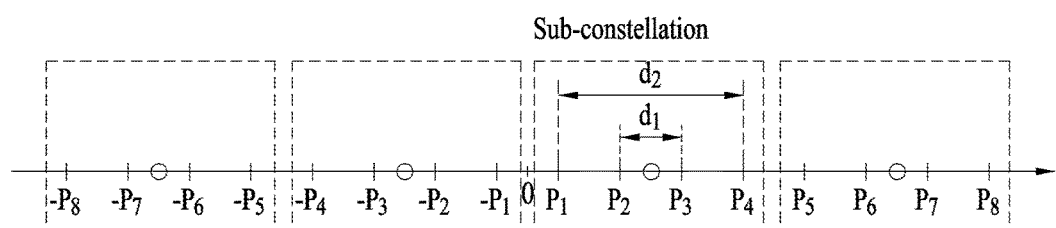
(a)
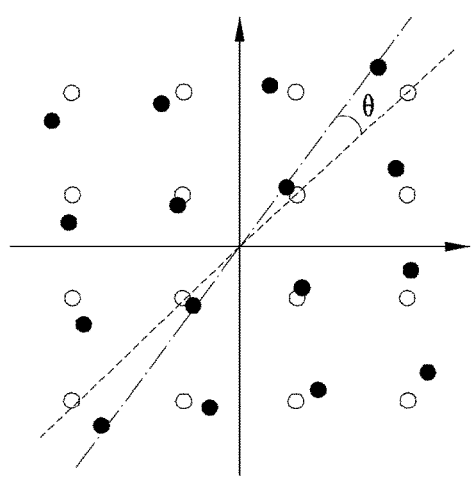
(b)

constellation of $r_1$          constellation of $r_2$

METHOD FOR TRANSMITTING BROADCASTING SIGNAL, METHOD FOR RECEIVING BROADCASTING SIGNAL, APPARATUS FOR TRANSMITTING BROADCASTING SIGNAL, AND APPARATUS FOR RECEIVING BROADCASTING SIGNAL

CROSS REFERENCE TO RELATED APPLICATIONS:

This application is the National Phase of PCT International Application No. PCT/KR2014/005835, filed on Jul. 1, 2014, which claims priority under 35 U.S.C. 119(e) to U.S. Provisional Application No. 61/843,860, filed on Jul. 8, 2013, all of which are hereby expressly incorporated by reference into the present application.

TECHNICAL FIELD

The present invention relates to a method for transmitting broadcast signals, an apparatus for receiving broadcast signals and methods for transmitting and receiving broadcast signals.

BACKGROUND ART

As analog broadcast signal transmission comes to an end, various technologies for transmitting/receiving digital broadcast signals are being developed. A digital broadcast signal may include a larger amount of video/audio data than an analog broadcast signal and further include various types of additional data in addition to the video/audio data.

That is, a digital broadcast system can provide HD (high definition) images, multi-channel audio and various additional services. However, data transmission efficiency for transmission of large amounts of data, robustness of transmission/reception networks and network flexibility in consideration of mobile reception equipment need to be improved for digital broadcast.

DISCLOSURE

Technical Problem

Accordingly, the present invention is directed to an apparatus for transmitting broadcast signals and an apparatus for receiving broadcast signals for future broadcast services and methods for transmitting and receiving broadcast signals for future broadcast services.

Technical Solution

The object of the present invention can be achieved by providing a method of transmitting a broadcast signal including encoding data of Physical Layer Pipes (PLPs) according to a code rate, wherein the encoding step includes, LDPC (Low Density Parity Check) encoding the data of at least one of the PLPs according to the code rate, bit interleaving the LDPC encoded data, and mapping the bit interleaved data into a constellation, wherein the constellation is one of QAM (Quadrature Amplitude Modulation), NUQ (Non-Uniform QAM) or NUC (Non-Uniform Constellation), building at least one signal frame by mapping the encoded data of PLPs, and modulating data of the built signal frame by OFDM (Orthogonal Frequency Division Multiplexing) method and transmitting the modulated data of the signal frame.

The NUQ may be non-uniform 64 QAM (NUQ-64).

The encoding step may further include SSD (Signal Space Diversity) encoding the constellation mapped data.

The mapping step may include spreading symbols of the constellation, and mapping the bit interleaved data into the spread symbols of the constellation.

The SSD encoding step may include dividing the spread constellation to which the data is mapped into a plurality of sub-constellations, and optimizing the constellation by re-arranging a distance in the sub-constellations.

In another aspect of the present invention, provided herein is a method of receiving a broadcast signal including receiving the broadcast signal and demodulating data of a signal frame in the received broadcast signal by OFDM (Orthogonal Frequency Division Multiplexing) method, parsing the signal frame by demapping the data of Physical Layer Pipes (PLPs), decoding the data of Physical Layer Pipes (PLPs) according to a code rate, wherein the decoding step includes, demapping the data of at least one of the PLPs from a constellation, wherein the constellation is one of QAM (Quadrature Amplitude Modulation), NUQ (Non-Uniform QAM) or NUC(Non-Uniform Constellation), bit de-interleaving the data demapped from the constellation, and LDPC (Low Density Parity Check) decoding the bit de-interleaved data according to the code rate.

The NUQ may be non-uniform 64 QAM (NUQ-64).

The decoding step further may include SSD (Signal Space Diversity) decoding the data of the at least one of PLPs.

The SSD decoding step may include re-arranging the constellation into which the data of the at least one of PLPs is mapped.

The demapping step which demaps the data of the at least one of the PLPs may include demapping the data of the at least one of the PLPs from the re-arranged constellation.

The re-arranging step may process and rearrange a real part and an imaginary part of a symbol of the constellation, independently.

In another aspect of the present invention, provided herein is an apparatus of transmitting a broadcast signal including an encoding module for encoding data of Physical Layer Pipes (PLPs) according to a code rate, wherein the encoding module includes, an LDPC (Low Density Parity Check) encoding block for encoding the data of at least one of the PLPs according to the code rate, a bit interleaving block for bit interleaving the LDPC encoded data, and a constellation mapping block for mapping the bit interleaved data into a constellation, wherein the constellation is one of QAM (Quadrature Amplitude Modulation), NUQ (Non-Uniform QAM) or NUC(Non-Uniform Constellation), a frame building module for building at least one signal frame by mapping the encoded data of PLPs, and an OFDM (Orthogonal Frequency Division Multiplexing) module for modulating data of the built signal frame by OFDM method and transmitting the modulated data of the signal frame.

The NUQ may be non-uniform 64 QAM (NUQ-64).

The encoding module may further include SSD (Signal Space Diversity) block for SSD encoding the constellation mapped data.

The constellation mapping block may spread symbols of the constellation, and map the bit interleaved data into the spread symbols of the constellation.

The SSD encoding block may divide the spread constellation to which the data is mapped into a plurality of sub-constellations, and optimize the constellation by re-arranging a distance in the sub-constellations.

In another aspect of the present invention, provided herein is an apparatus of receiving a broadcast signal including an OFDM (Orthogonal Frequency Division Multiplexing) module for receiving the broadcast signal and demodulating data of a signal frame in the received broadcast signal by OFDM method, a parsing module for parsing the signal frame by demapping the data of Physical Layer Pipes (PLPs), a decoding module for decoding the data of Physical Layer Pipes (PLPs) according to a code rate, wherein the decoding module includes, a demapping block for demapping the data of at least one of the PLPs from a constellation, wherein the constellation is one of QAM (Quadrature Amplitude Modulation), NUQ (Non-Uniform QAM) or NUC(Non-Uniform Constellation), a bit de-interleaving block for bit de-interleaving the data demapped from the constellation, and an LDPC (Low Density Parity Check) decoding block for LDPC decoding the bit de-interleaved data according to the code rate.

The NUQ may be non-uniform 64 QAM (NUQ-64).

The decoding module further may include SSD (Signal Space Diversity) block for SSD decoding the data of the at least one of PLPs.

The SSD decoding block may re-arrange the constellation into which the data of the at least one of PLPs is mapped.

The demapping block may demap the data of the at least one of the PLPs from the re-arranged constellation.

The SSD decoding block may process and rearrange a real part and an imaginary part of a symbol of the constellation, independently.

Advantageous Effects

The present invention may provide an efficient broadcast signal transmission method, an efficient broadcast signal reception method, an efficient broadcast signal transmission apparatus, and an efficient broadcast signal reception apparatus.

In addition, the present invention may enhance transmission efficiency and enhance robustness of transmission and reception of broadcast signals.

DESCRIPTION OF DRAWINGS

FIG. 19 illustrates a constellation of multiple spread symbols and a constellation of rearranged multiple symbols according to an embodiment of the present invention.

FIG. 21 illustrates a constellation optimization process and a rearranged constellation according to an embodiment of the present invention.

FIG. 23 illustrates a constellation optimization process and a rearranged constellation according to another embodiment of the present invention.

BEST MODE

Although most terms used in the present invention have been selected from general ones widely used in the art, some terms have been arbitrarily selected by the applicant and their meanings are explained in detail in the following description as needed. Thus, the present invention should be understood based upon the intended meanings of the terms rather than their simple names or meanings.

The present invention provides apparatuses and methods for transmitting and receiving broadcast signals for future broadcast services. Future broadcast services according to an embodiment of the present invention include a terrestrial broadcast service, a mobile broadcast service, a UHDTV service, etc. The present invention may process broadcast signals for the future broadcast services through non-MIMO (Multiple Input Multiple Output) or MIMO according to one embodiment. A non-MIMO scheme according to an embodiment of the present invention may include a MISO (Multiple Input Single Output) scheme, a SISO (Single Input Single Output) scheme, etc.

While MISO or MIMO uses two antennas in the following for convenience of description, the present invention is applicable to systems using two or more antennas.

Figure 1:
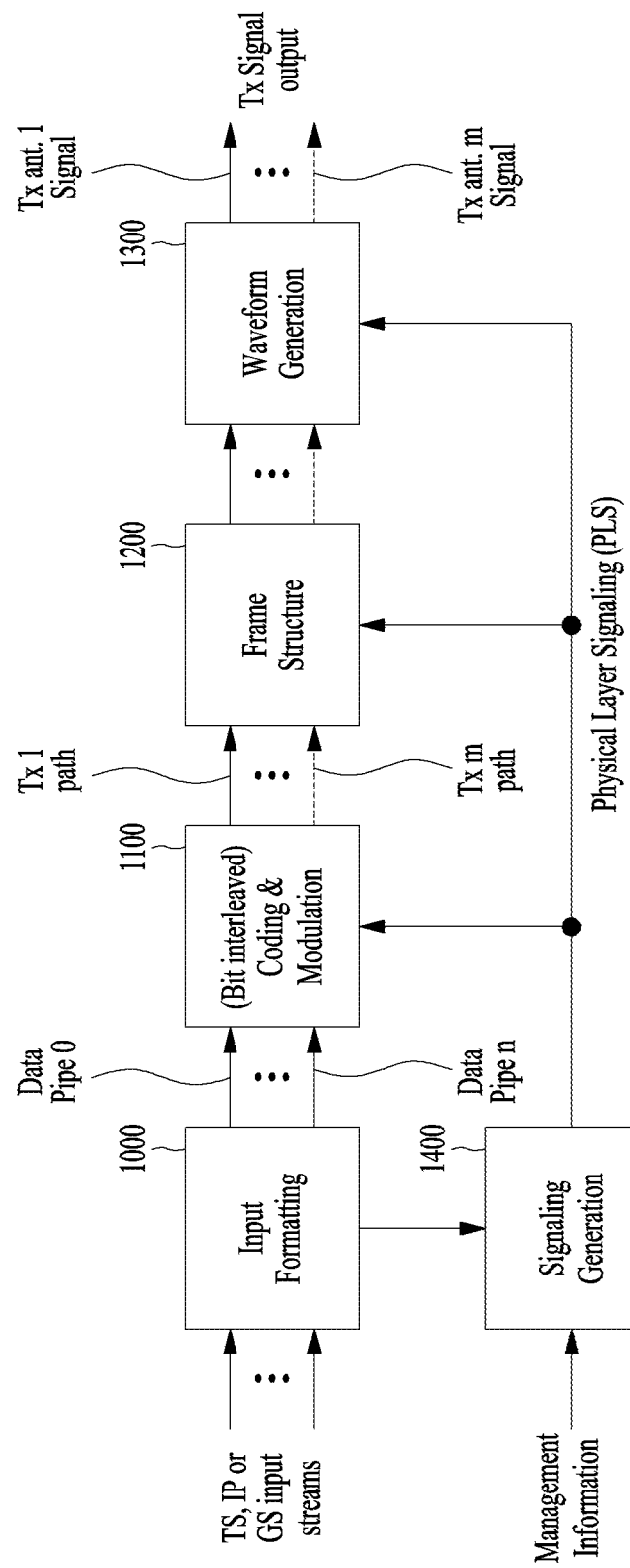
FIG. 1 illustrates a structure of an apparatus for transmitting broadcast signals for future broadcast services according to an embodiment of the present invention.

FIG. 1 illustrates a structure of an apparatus for transmitting broadcast signals for future broadcast services according to an embodiment of the present invention.

The apparatus for transmitting broadcast signals for future broadcast services according to an embodiment of the present invention can include an input formatting module 1000, a coding & modulation module 1100, a frame structure module 1200, a waveform generation module 1300 and a signaling generation module 1400. A description will be given of the operation of each module of the apparatus for transmitting broadcast signals.

Referring to FIG. 1, the apparatus for transmitting broadcast signals for future broadcast services according to an embodiment of the present invention can receive MPEG-TSs, IP streams (v4/v6) and generic streams (GSs) as an input signal. In addition, the apparatus for transmitting broadcast signals can receive management information about the configuration of each stream constituting the input signal and generate a final physical layer signal with reference to the received management information.

The input formatting module 1000 according to an embodiment of the present invention can classify the input streams on the basis of a standard for coding and modulation or services or service components and output the input streams as a plurality of logical data pipes (or data pipes or DP data). The data pipe is a logical channel in the physical layer that carries service data or related metadata, which may carry one or multiple service(s) or service component(s). In addition, data transmitted through each data pipe may be called DP data.

In addition, the input formatting module 1000 according to an embodiment of the present invention can divide each data pipe into blocks necessary to perform coding and modulation and carry out processes necessary to increase transmission efficiency or to perform scheduling. Details of operations of the input formatting module 1000 will be described later.

The coding & modulation module 1100 according to an embodiment of the present invention can perform forward error correction (FEC) encoding on each data pipe received from the input formatting module 1000 such that an apparatus for receiving broadcast signals can correct an error that may be generated on a transmission channel. In addition, the coding & modulation module 1100 according to an embodiment of the present invention can convert FEC output bit data to symbol data and interleave the symbol data to correct burst error caused by a channel. As shown in FIG. 1, the coding & modulation module 1100 according to an embodiment of the present invention can divide the processed data such that the divided data can be output through data paths for respective antenna outputs in order to transmit the data through two or more Tx antennas.

The frame structure module 1200 according to an embodiment of the present invention can map the data output from the coding & modulation module 1100 to signal frames. The frame structure module 1200 according to an embodiment of the present invention can perform mapping using scheduling information output from the input formatting module 1000 and interleave data in the signal frames in order to obtain additional diversity gain.

The waveform generation module 1300 according to an embodiment of the present invention can convert the signal frames output from the frame structure module 1200 into a signal for transmission. In this case, the waveform generation module 1300 according to an embodiment of the present invention can insert a preamble signal (or preamble) into the signal for detection of the transmission apparatus and insert a reference signal for estimating a transmission channel to compensate for distortion into the signal. In addition, the waveform generation module 1300 according to an embodiment of the present invention can provide a guard interval and insert a specific sequence into the same in order to offset the influence of channel delay spread due to multi-path reception. Additionally, the waveform generation module 1300 according to an embodiment of the present invention can perform a procedure necessary for efficient transmission in consideration of signal characteristics such as a peak-to-average power ratio of the output signal.

The signaling generation module 1400 according to an embodiment of the present invention generates final physical layer signaling information using the input management information and information generated by the input formatting module 1000, coding & modulation module 1100 and frame structure module 1200. Accordingly, a reception apparatus according to an embodiment of the present invention can decode a received signal by decoding the signaling information.

As described above, the apparatus for transmitting broadcast signals for future broadcast services according to one embodiment of the present invention can provide terrestrial broadcast service, mobile broadcast service, UHDTV service, etc. Accordingly, the apparatus for transmitting broadcast signals for future broadcast services according to one embodiment of the present invention can multiplex signals for different services in the time domain and transmit the same.

Figure 2:
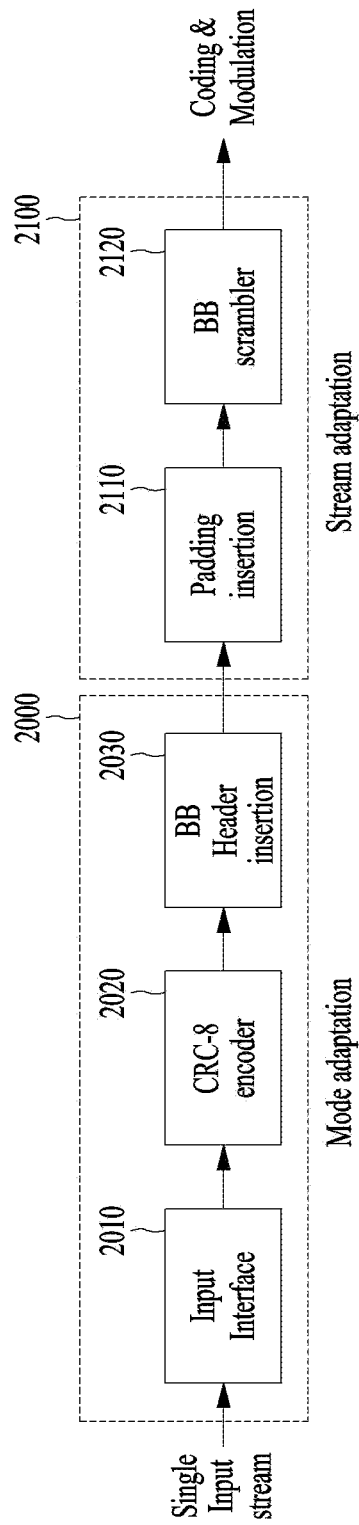
FIG. 2 illustrates an input formatting module according to an embodiment of the present invention.
Figure 3:
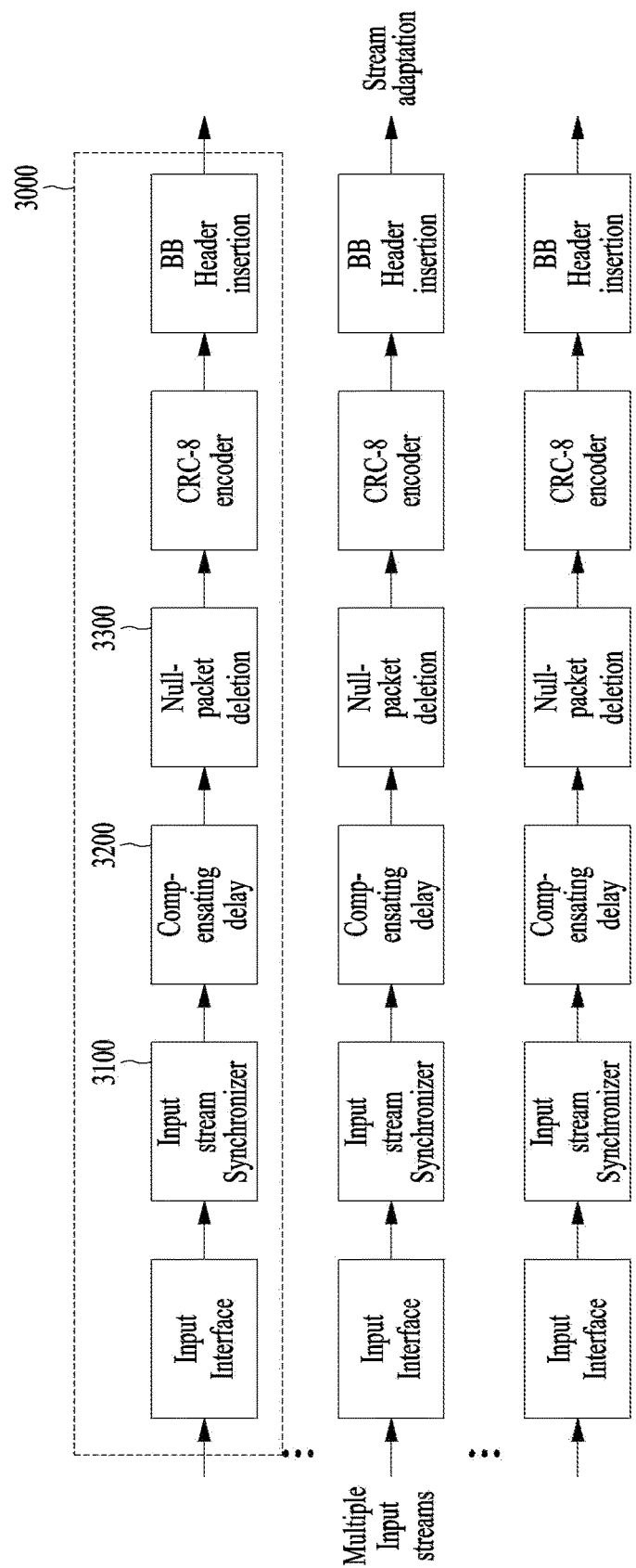
FIG. 3 illustrates an input formatting module according to another embodiment of the present invention.
Figure 4:
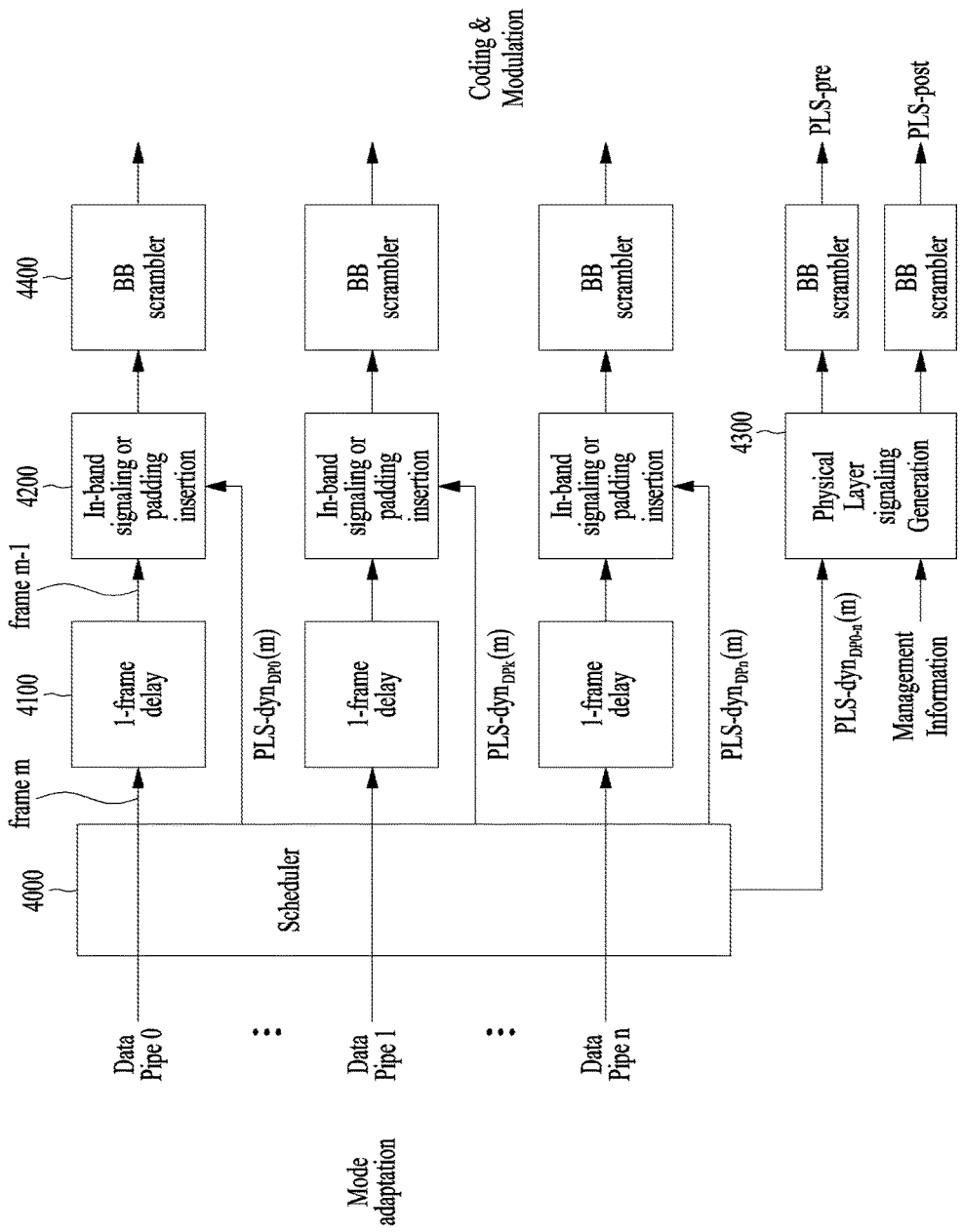
FIG. 4 illustrates an input formatting module according to another embodiment of the present invention.

FIGS. 2, 3 and 4 illustrate the input formatting module 1000 according to embodiments of the present invention. A description will be given of each figure.

FIG. 2 illustrates an input formatting module according to one embodiment of the present invention. FIG. 2 shows an input formatting module when the input signal is a single input stream.

Referring to FIG. 2, the input formatting module according to one embodiment of the present invention can include a mode adaptation module 2000 and a stream adaptation module 2100.

As shown in FIG. 2, the mode adaptation module 2000 can include an input interface block 2010, a CRC-8 encoder block 2020 and a BB header insertion block 2030. Description will be given of each block of the mode adaptation module 2000.

The input interface block 2010 can divide the single input stream input thereto into data pieces each having the length of a baseband (BB) frame used for FEC (BCH/LDPC) which will be performed later and output the data pieces.

The CRC-8 encoder block 2020 can perform CRC encoding on BB frame data to add redundancy data thereto.

The BB header insertion block 2030 can insert, into the BB frame data, a header including information such as mode adaptation type (TS/GS/IP), a user packet length, a data field length, user packet sync byte, start address of user packet sync byte in data field, a high efficiency mode indicator, an input stream synchronization field, etc.

As shown in FIG. 2, the stream adaptation module 2100 can include a padding insertion block 2110 and a BB scrambler block 2120. Description will be given of each block of the stream adaptation module 2100.

If data received from the mode adaptation module 2000 has a length shorter than an input data length necessary for FEC encoding, the padding insertion block 2110 can insert a padding bit into the data such that the data has the input data length and output the data including the padding bit.

The BB scrambler block 2120 can randomize the input bit stream by performing an XOR operation on the input bit stream and a pseudo random binary sequence (PRBS).

The above-described blocks may be omitted or replaced by blocks having similar or identical functions.

As shown in FIG. 2, the input formatting module can finally output data pipes to the coding & modulation module.

FIG. 3 illustrates an input formatting module according to another embodiment of the present invention. FIG. 3 shows a mode adaptation module 3000 of the input formatting module when the input signal corresponds to multiple input streams.

The mode adaptation module 3000 of the input formatting module for processing the multiple input streams can independently process the multiple input streams.

Referring to FIG. 3, the mode adaptation module 3000 for respectively processing the multiple input streams can include input interface blocks, input stream synchronizer blocks 3100, compensating delay blocks 3200, null packet deletion blocks 3300, CRC-8 encoder blocks and BB header insertion blocks. Description will be given of each block of the mode adaptation module 3000.

Operations of the input interface block, CRC-8 encoder block and BB header insertion block correspond to those of the input interface block, CRC-8 encoder block and BB header insertion block described with reference to FIG. 2 and thus description thereof is omitted.

The input stream synchronizer block 3100 can transmit input stream clock reference (ISCR) information to generate timing information necessary for the apparatus for receiving broadcast signals to restore the TSs or GSs.

The compensating delay block 3200 can delay input data and output the delayed input data such that the apparatus for receiving broadcast signals can synchronize the input data if a delay is generated between data pipes according to processing of data including the timing information by the transmission apparatus.

The null packet deletion block 3300 can delete unnecessarily transmitted input null packets from the input data, insert the number of deleted null packets into the input data based on positions in which the null packets are deleted and transmit the input data.

The above-described blocks may be omitted or replaced by blocks having similar or identical functions.

FIG. 4 illustrates an input formatting module according to another embodiment of the present invention.

Specifically, FIG. 4 illustrates a stream adaptation module of the input formatting module when the input signal corresponds to multiple input streams.

The stream adaptation module of the input formatting module when the input signal corresponds to multiple input streams can include a scheduler 4000, a 1-frame delay block 4100, an in-band signaling or padding insertion block 4200, a physical layer signaling generation block 4300 and a BB scrambler block 4400. Description will be given of each block of the stream adaptation module.

The scheduler 4000 can perform scheduling for a MIMO system using multiple antennas having dual polarity. In addition, the scheduler 4000 can generate parameters for use in signal processing blocks for antenna paths, such as a bit-to-cell demux block, a cell interleaver block, a time interleaver block, etc. included in the coding & modulation module illustrated in FIG. 1.

The 1-frame delay block 4100 can delay the input data by one transmission frame such that scheduling information about the next frame can be transmitted through the current frame for in-band signaling information to be inserted into the data pipes.

The in-band signaling or padding insertion block 4200 can insert undelayed physical layer signaling (PLS)-dynamic signaling information into the data delayed by one transmission frame. In this case, the in-band signaling or padding insertion block 4200 can insert a padding bit when a space for padding is present or insert in-band signaling information into the padding space. In addition, the scheduler 4000 can output physical layer signaling-dynamic signaling information about the current frame separately from in-band signaling information. Accordingly, a cell mapper, which will be described later, can map input cells according to scheduling information output from the scheduler 4000.

The physical layer signaling generation block 4300 can generate physical layer signaling data which will be transmitted through a preamble symbol of a transmission frame or spread and transmitted through a data symbol other than the in-band signaling information. In this case, the physical layer signaling data according to an embodiment of the present invention can be referred to as signaling information. Furthermore, the physical layer signaling data according to an embodiment of the present invention can be divided into PLS-pre information and PLS-post information. The PLS-pre information can include parameters necessary to encode the PLS-post information and static PLS signaling data and the PLS-post information can include parameters necessary to encode the data pipes. The parameters necessary to encode the data pipes can be classified into static PLS signaling data and dynamic PLS signaling data. The static PLS signaling data is a parameter commonly applicable to all frames included in a super-frame and can be changed on a super-frame basis. The dynamic PLS signaling data is a parameter differently applicable to respective frames included in a super-frame and can be changed on a frame-by-frame basis. Accordingly, the reception apparatus can acquire the PLS-post information by decoding the PLS-pre information and decode desired data pipes by decoding the PLS-post information.

The BB scrambler block 4400 can generate a pseudo-random binary sequence (PRBS) and perform an XOR operation on the PRBS and the input bit streams to decrease the peak-to-average power ratio (PAPR) of the output signal of the waveform generation block. As shown in FIG. 4, scrambling of the BB scrambler block 4400 is applicable to both data pipes and physical layer signaling information.

The above-described blocks may be omitted or replaced by blocks having similar or identical functions according to designer.

As shown in FIG. 4, the stream adaptation module can finally output the data pipes to the coding & modulation module.

Figure 5:
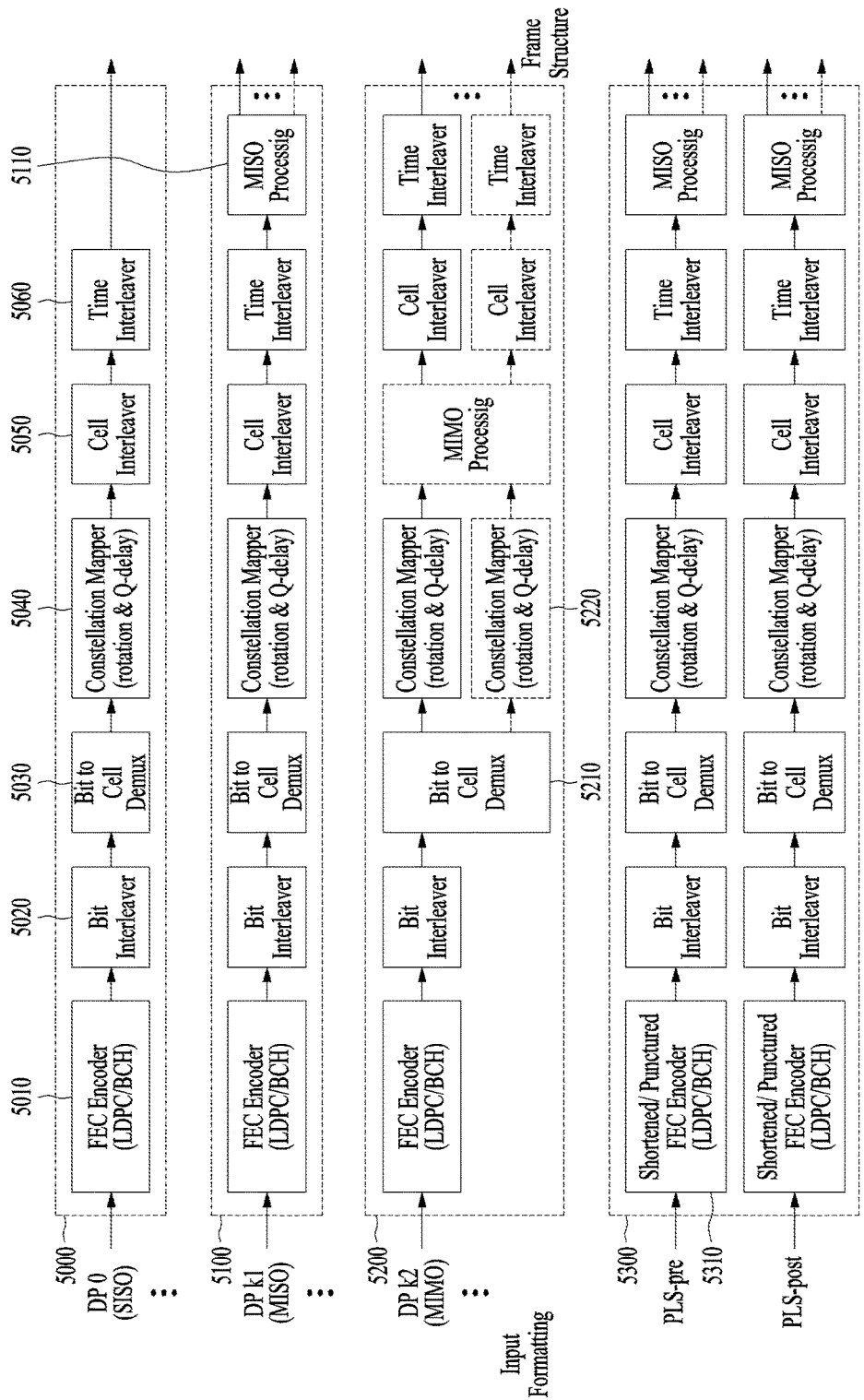
FIG. 5 illustrates a coding & modulation module according to an embodiment of the present invention.

FIG. 5 illustrates a coding & modulation module according to an embodiment of the present invention.

The coding & modulation module shown in FIG. 5 corresponds to an embodiment of the coding & modulation module illustrated in FIG. 1.

As described above, the apparatus for transmitting broadcast signals for future broadcast services according to an embodiment of the present invention can provide a terrestrial broadcast service, mobile broadcast service, UHDTV service, etc.

Since QoS (quality of service) depends on characteristics of a service provided by the apparatus for transmitting broadcast signals for future broadcast services according to an embodiment of the present invention, data corresponding to respective services needs to be processed through different schemes. Accordingly, the coding & modulation module according to an embodiment of the present invention can independently process data pipes input thereto by independently applying SISO, MISO and MIMO schemes to the data pipes respectively corresponding to data paths. Consequently, the apparatus for transmitting broadcast signals for future broadcast services according to an embodiment of the present invention can control QoS for each service or service component transmitted through each data pipe.

Accordingly, the coding & modulation module according to an embodiment of the present invention can include a first block 5000 for SISO, a second block 5100 for MISO, a third block 5200 for MIMO and a fourth block 5300 for processing the PLS-pre/PLS-post information. The coding & modulation module illustrated in FIG. 5 is an exemplary and may include only the first block 5000 and the fourth block 5300, the second block 5100 and the fourth block 5300 or the third block 5200 and the fourth block 5300 according to design. That is, the coding & modulation module can include blocks for processing data pipes equally or differently according to design.

A description will be given of each block of the coding & modulation module.

The first block 5000 processes an input data pipe according to SISO and can include an FEC encoder block 5010, a bit interleaver block 5020, a bit-to-cell demux block 5030, a constellation mapper block 5040, a cell interleaver block 5050 and a time interleaver block 5060.

The FEC encoder block 5010 can perform BCH encoding and LDPC encoding on the input data pipe to add redundancy thereto such that the reception apparatus can correct an error generated on a transmission channel.

The bit interleaver block 5020 can interleave bit streams of the FEC-encoded data pipe according to an interleaving rule such that the bit streams have robustness against burst error that may be generated on the transmission channel. Accordingly, when deep fading or erasure is applied to QAM symbols, errors can be prevented from being generated in consecutive bits from among all codeword bits since interleaved bits are mapped to the QAM symbols.

The bit-to-cell demux block 5030 can determine the order of input bit streams such that each bit in an FEC block can be transmitted with appropriate robustness in consideration of both the order of input bit streams and a constellation mapping rule.

The constellation mapper block 5040 can map a bit word input thereto to one constellation. In this case, the constellation mapper block 5040 can additionally perform rotation & Q-delay. That is, the constellation mapper block 5040 can rotate input constellations according to a rotation angle, divide the constellations into an in-phase component and a quadrature-phase component and delay only the quadrature-phase component by an arbitrary value. Then, the constellation mapper block 5040 can remap the constellations to new constellations using a paired in-phase component and quadrature-phase component.

The cell interleaver block 5050 can randomly interleave cells corresponding to one FEC block and output the interleaved cells such that cells corresponding to respective FEC blocks can be output in different orders.

The time interleaver block 5060 can interleave cells belonging to a plurality of FEC blocks and output the interleaved cells. Accordingly, the cells corresponding to the FEC blocks are dispersed and transmitted in a period corresponding to a time interleaving depth and thus diversity gain can be obtained.

The second block 5100 processes an input data pipe according to MISO and can include the FEC encoder block, bit interleaver block, bit-to-cell demux block, constellation mapper block, cell interleaver block and time interleaver block in the same manner as the first block 5000. However, the second block 5100 is distinguished from the first block 5000 in that the second block 5100 further includes a MISO processing block 5110. The second block 5100 performs the same procedure including the input operation to the time interleaver operation as those of the first block 5000 and thus description of the corresponding blocks is omitted.

The MISO processing block 5110 can encode input cells according to a MISO encoding matrix providing transmit diversity and output MISO-processed data through two paths. MISO processing according to one embodiment of the present invention can include OSTBC (orthogonal space time block coding)/OSFBC (orthogonal space frequency block coding, Alamouti coding).

The third block 5200 processes an input data pipe according to MIMO and can include the FEC encoder block, bit interleaver block, bit-to-cell demux block, constellation mapper block, cell interleaver block and time interleaver block in the same manner as the second block 5100, as shown in FIG. 5. However, the data processing procedure of the third block 5200 is different from that of the second block 5100 since the third block 5200 includes a MIMO processing block 5220.

That is, in the third block 5200, basic roles of the FEC encoder block and the bit interleaver block are identical to those of the first and second blocks 5000 and 5100 although functions thereof may be different from those of the first and second blocks 5000 and 5100.

The bit-to-cell demux block 5210 can generate as many output bit streams as input bit streams of MIMO processing and output the output bit streams through MIMO paths for MIMO processing. In this case, the bit-to-cell demux block 5210 can be designed to optimize the decoding performance of the reception apparatus in consideration of characteristics of LDPC and MIMO processing.

Basic roles of the constellation mapper block, cell interleaver block and time interleaver block are identical to those of the first and second blocks 5000 and 5100 although functions thereof may be different from those of the first and second blocks 5000 and 5100. As shown in FIG. 5, as many constellation mapper blocks, cell interleaver blocks and time interleaver blocks as the number of MIMO paths for MIMO processing can be present. In this case, the constellation mapper blocks, cell interleaver blocks and time interleaver blocks can operate equally or independently for data input through the respective paths.

The MIMO processing block 5220 can perform MIMO processing on two input cells using a MIMO encoding matrix and output the MIMO-processed data through two paths. The MIMO encoding matrix according to an embodiment of the present invention can include spatial multiplexing, Golden code, full-rate full diversity code, linear dispersion code, etc.

The fourth block 5300 processes the PLS-pre/PLS-post information and can perform SISO or MISO processing.

The basic roles of the bit interleaver block, bit-to-cell demux block, constellation mapper block, cell interleaver block, time interleaver block and MISO processing block included in the fourth block 5300 correspond to those of the second block 5100 although functions thereof may be different from those of the second block 5100.

A shortened/punctured FEC encoder block 5310 included in the fourth block 5300 can process PLS data using an FEC encoding scheme for a PLS path provided for a case in which the length of input data is shorter than a length necessary to perform FEC encoding. Specifically, the shortened/punctured FEC encoder block 5310 can perform BCH encoding on input bit streams, pad 0s corresponding to a desired input bit stream length necessary for normal LDPC encoding, carry out LDPC encoding and then remove the padded 0s to puncture parity bits such that an effective code rate becomes equal to or lower than the data pipe rate.

The blocks included in the first block 5000 to fourth block 5300 may be omitted or replaced by blocks having similar or identical functions according to design.

As illustrated in FIG. 5, the coding & modulation module can output the data pipes (or DP data), PLS-pre information and PLS-post information processed for the respective paths to the frame structure module.

Figure 6:
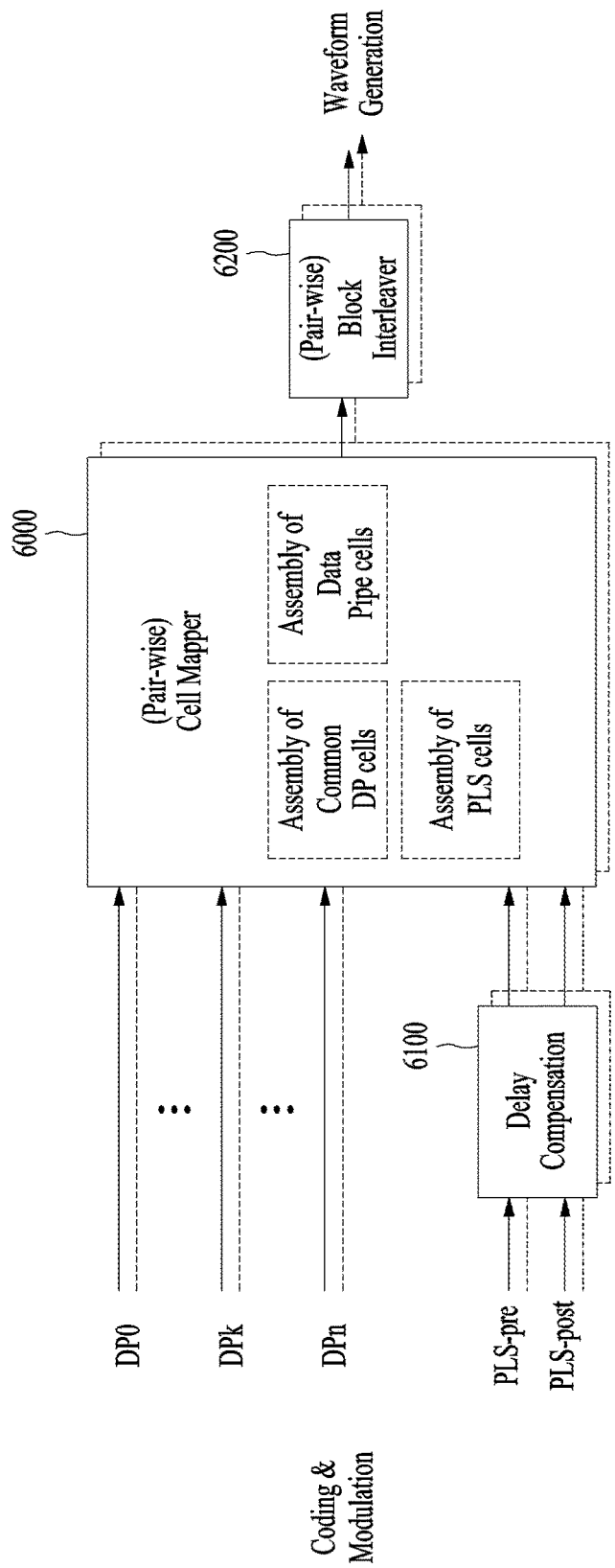
FIG. 6 illustrates a frame structure module according to an embodiment of the present invention.

FIG. 6 illustrates a frame structure module according to one embodiment of the present invention.

The frame structure module shown in FIG. 6 corresponds to an embodiment of the frame structure module 1200 illustrated in FIG. 1.

The frame structure module according to one embodiment of the present invention can include at least one cell-mapper 6000, at least one delay compensation module 6100 and at least one block interleaver 6200. The number of cell mappers 6000, delay compensation modules 6100 and block interleavers 6200 can be changed. A description will be given of each module of the frame structure block.

The cell-mapper 6000 can allocate cells corresponding to SISO-, MISO- or MIMO-processed data pipes output from the coding & modulation module, cells corresponding to common data commonly applicable to the data pipes and cells corresponding to the PLS-pre/PLS-post information to signal frames according to scheduling information. The common data refers to signaling information commonly applied to all or some data pipes and can be transmitted through a specific data pipe. The data pipe through which the common data is transmitted can be referred to as a common data pipe and can be changed according to design.

When the apparatus for transmitting broadcast signals according to an embodiment of the present invention uses two output antennas and Alamouti coding is used for MISO processing, the cell-mapper 6000 can perform pair-wise cell mapping in order to maintain orthogonality according to Alamouti encoding. That is, the cell-mapper 6000 can process two consecutive cells of the input cells as one unit and map the unit to a frame. Accordingly, paired cells in an input path corresponding to an output path of each antenna can be allocated to neighboring positions in a transmission frame.

The delay compensation block 6100 can obtain PLS data corresponding to the current transmission frame by delaying input PLS data cells for the next transmission frame by one frame. In this case, the PLS data corresponding to the current frame can be transmitted through a preamble part in the current signal frame and PLS data corresponding to the next signal frame can be transmitted through a preamble part in the current signal frame or in-band signaling in each data pipe of the current signal frame. This can be changed by the designer.

The block interleaver 6200 can obtain additional diversity gain by interleaving cells in a transport block corresponding to the unit of a signal frame. In addition, the block interleaver 6200 can perform interleaving by processing two consecutive cells of the input cells as one unit when the above-described pair-wise cell mapping is performed. Accordingly, cells output from the block interleaver 6200 can be two consecutive identical cells.

When pair-wise mapping and pair-wise interleaving are performed, at least one cell mapper and at least one block interleaver can operate equally or independently for data input through the paths.

The above-described blocks may be omitted or replaced by blocks having similar or identical functions according to design.

Figure 7:
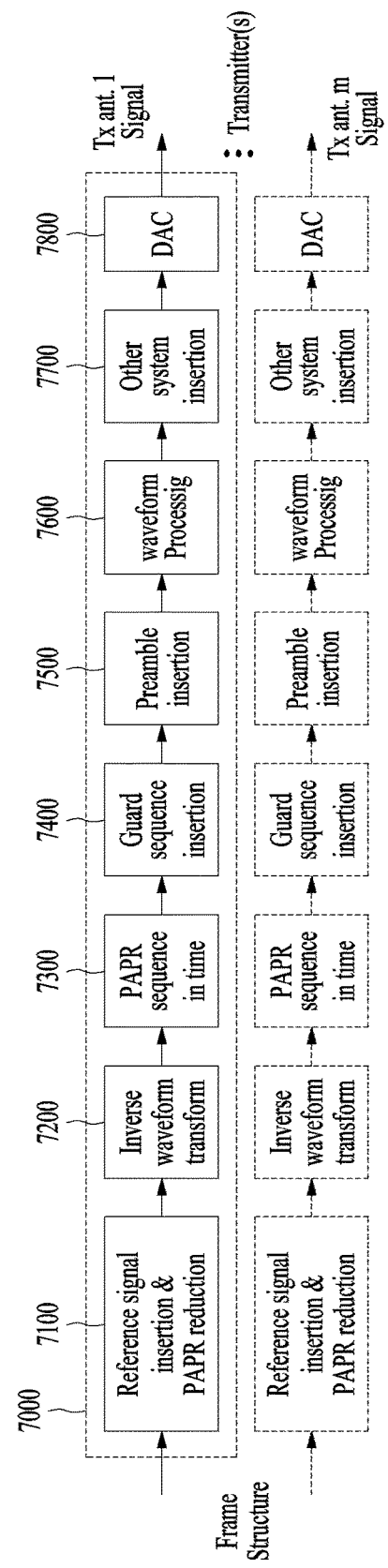
FIG. 7 illustrates a waveform generation module according to an embodiment of the present invention.

FIG. 7 illustrates a waveform generation module according to an embodiment of the present invention.

The waveform generation module illustrated in FIG. 7 corresponds to an embodiment of the waveform generation module 1300 described with reference to FIG. 1.

The waveform generation module according to an embodiment of the present invention can modulate and transmit as many signal frames as the number of antennas for receiving and outputting signal frames output from the frame structure module illustrated in FIG. 6.

Specifically, the waveform generation module illustrated in FIG. 7 is an embodiment of a waveform generation module of an apparatus for transmitting broadcast signals using m Tx antennas and can include m processing blocks for modulating and outputting frames corresponding to m paths. The m processing blocks can perform the same processing procedure. A description will be given of operation of the first processing block 7000 from among the m processing blocks.

The first processing block 7000 can include a reference signal & PAPR reduction block 7100, an inverse waveform transform block 7200, a PAPR reduction in time block 7300, a guard sequence insertion block 7400, a preamble insertion block 7500, a waveform processing block 7600, other system insertion block 7700 and a DAC (digital analog converter) block 7800.

The reference signal insertion & PAPR reduction block 7100 can insert a reference signal into a predetermined position of each signal block and apply a PAPR reduction scheme to reduce a PAPR in the time domain. If a broadcast transmission/reception system according to an embodiment of the present invention corresponds to an OFDM system, the reference signal insertion & PAPR reduction block 7100 can use a method of reserving some active subcarriers rather than using the same. In addition, the reference signal insertion & PAPR reduction block 7100 may not use the PAPR reduction scheme as an optional feature according to broadcast transmission/reception system.

The inverse waveform transform block 7200 can transform an input signal in a manner of improving transmission efficiency and flexibility in consideration of transmission channel characteristics and system architecture. If the broadcast transmission/reception system according to an embodiment of the present invention corresponds to an OFDM system, the inverse waveform transform block 7200 can employ a method of transforming a frequency domain signal into a time domain signal through inverse FFT operation. If the broadcast transmission/reception system according to an embodiment of the present invention corresponds to a single carrier system, the inverse waveform transform block 7200 may not be used in the waveform generation module.

The PAPR reduction in time block 7300 can use a method for reducing PAPR of an input signal in the time domain. If the broadcast transmission/reception system according to an embodiment of the present invention corresponds to an OFDM system, the PAPR reduction in time block 7300 may use a method of simply clipping peak amplitude. Furthermore, the PAPR reduction in time block 7300 may not be used in the broadcast transmission/reception system according to an embodiment of the present invention since it is an optional feature.

The guard sequence insertion block 7400 can provide a guard interval between neighboring signal blocks and insert a specific sequence into the guard interval as necessary in order to minimize the influence of delay spread of a transmission channel. Accordingly, the reception apparatus can easily perform synchronization or channel estimation. If the broadcast transmission/reception system according to an embodiment of the present invention corresponds to an OFDM system, the guard sequence insertion block 7400 may insert a cyclic prefix into a guard interval of an OFDM symbol.

The preamble insertion block 7500 can insert a signal of a known type (e.g. the preamble or preamble symbol) agreed upon between the transmission apparatus and the reception apparatus into a transmission signal such that the reception apparatus can rapidly and efficiently detect a target system signal. If the broadcast transmission/reception system according to an embodiment of the present invention corresponds to an OFDM system, the preamble insertion block 7500 can define a signal frame composed of a plurality of OFDM symbols and insert a preamble symbol into the beginning of each signal frame. That is, the preamble carries basic PLS data and is located in the beginning of a signal frame.

The waveform processing block 7600 can perform waveform processing on an input baseband signal such that the input baseband signal meets channel transmission characteristics. The waveform processing block 7600 may use a method of performing square-root-raised cosine (SRRC) filtering to obtain a standard for out-of-band emission of a transmission signal. If the broadcast transmission/reception system according to an embodiment of the present invention corresponds to a multi-carrier system, the waveform processing block 7600 may not be used.

The other system insertion block 7700 can multiplex signals of a plurality of broadcast transmission/reception systems in the time domain such that data of two or more different broadcast transmission/reception systems providing broadcast services can be simultaneously transmitted in the same RF signal bandwidth. In this case, the two or more different broadcast transmission/reception systems refer to systems providing different broadcast services. The different broadcast services may refer to a terrestrial broadcast service, mobile broadcast service, etc. Data related to respective broadcast services can be transmitted through different frames.

The DAC block 7800 can convert an input digital signal into an analog signal and output the analog signal. The signal output from the DAC block 7800 can be transmitted through m output antennas. A Tx antenna according to an embodiment of the present invention can have vertical or horizontal polarity.

The above-described blocks may be omitted or replaced by blocks having similar or identical functions according to design.

Figure 8:
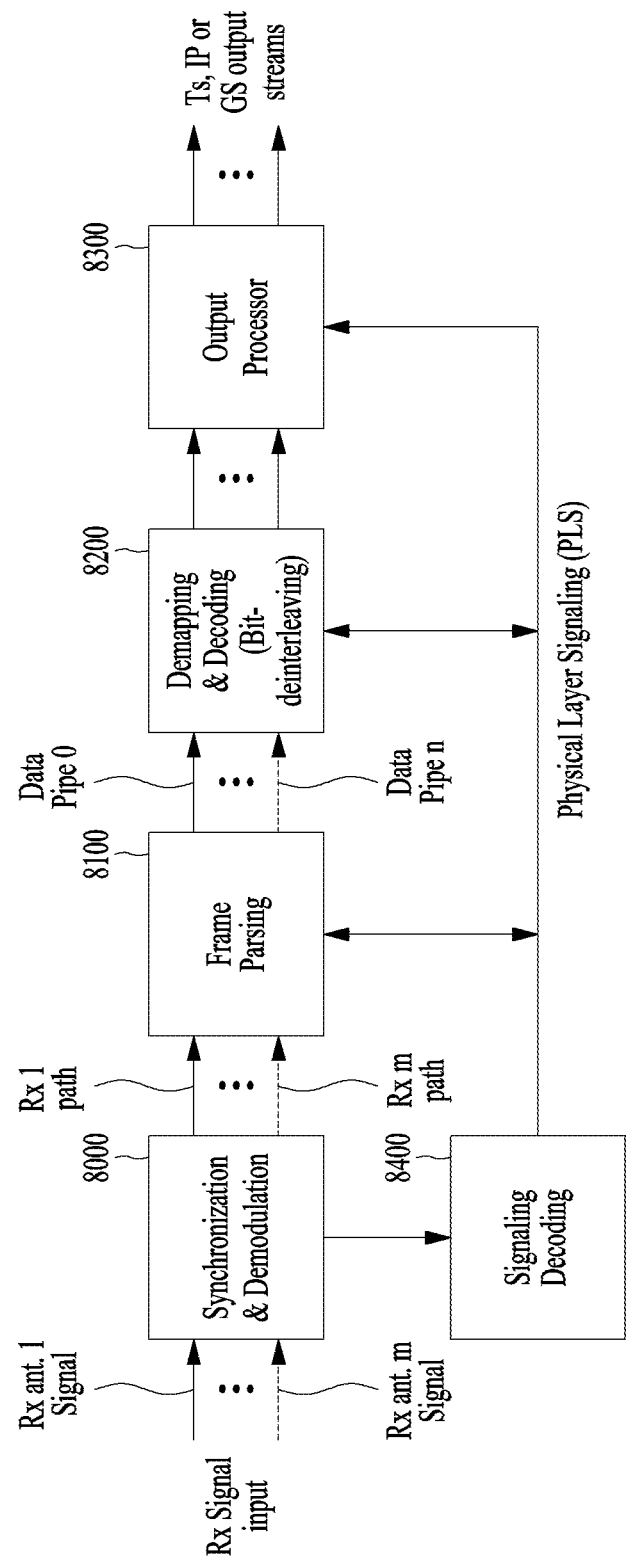
FIG. 8 illustrates a structure of an apparatus for receiving broadcast signals for future broadcast services according to an embodiment of the present invention.

FIG. 8 illustrates a structure of an apparatus for receiving broadcast signals for future broadcast services according to an embodiment of the present invention.

The apparatus for receiving broadcast signals for future broadcast services according to an embodiment of the present invention can correspond to the apparatus for transmitting broadcast signals for future broadcast services, described with reference to FIG. 1. The apparatus for receiving broadcast signals for future broadcast services according to an embodiment of the present invention can include a synchronization & demodulation module 8000, a frame parsing module 8100, a demapping & decoding module 8200, an output processor 8300 and a signaling decoding module 8400. A description will be given of operation of each module of the apparatus for receiving broadcast signals.

The synchronization & demodulation module 8000 can receive input signals through m Rx antennas, perform signal detection and synchronization with respect to a system corresponding to the apparatus for receiving broadcast signals and carry out demodulation corresponding to a reverse procedure of the procedure performed by the apparatus for transmitting broadcast signals.

The frame parsing module 8100 can parse input signal frames and extract data through which a service selected by a user is transmitted. If the apparatus for transmitting broadcast signals performs interleaving, the frame parsing module 8100 can carry out deinterleaving corresponding to a reverse procedure of interleaving. In this case, the positions of a signal and data that need to be extracted can be obtained by decoding data output from the signaling decoding module 8400 to restore scheduling information generated by the apparatus for transmitting broadcast signals.

The demapping & decoding module 8200 can convert the input signals into bit domain data and then deinterleave the same as necessary. The demapping & decoding module 8200 can perform demapping for mapping applied for transmission efficiency and correct an error generated on a transmission channel through decoding. In this case, the demapping & decoding module 8200 can obtain transmission parameters necessary for demapping and decoding by decoding the data output from the signaling decoding module 8400.

The output processor 8300 can perform reverse procedures of various compression/signal processing procedures which are applied by the apparatus for transmitting broadcast signals to improve transmission efficiency. In this case, the output processor 8300 can acquire necessary control information from data output from the signaling decoding module 8400. The output of the output processor 8300 corresponds to a signal input to the apparatus for transmitting broadcast signals and may be MPEG-TSs, IP streams (v4 or v6) and generic streams.

The signaling decoding module 8400 can obtain PLS information from the signal demodulated by the synchronization & demodulation module 8000. As described above, the frame parsing module 8100, demapping & decoding module 8200 and output processor 8300 can execute functions thereof using the data output from the signaling decoding module 8400.

Figure 9:
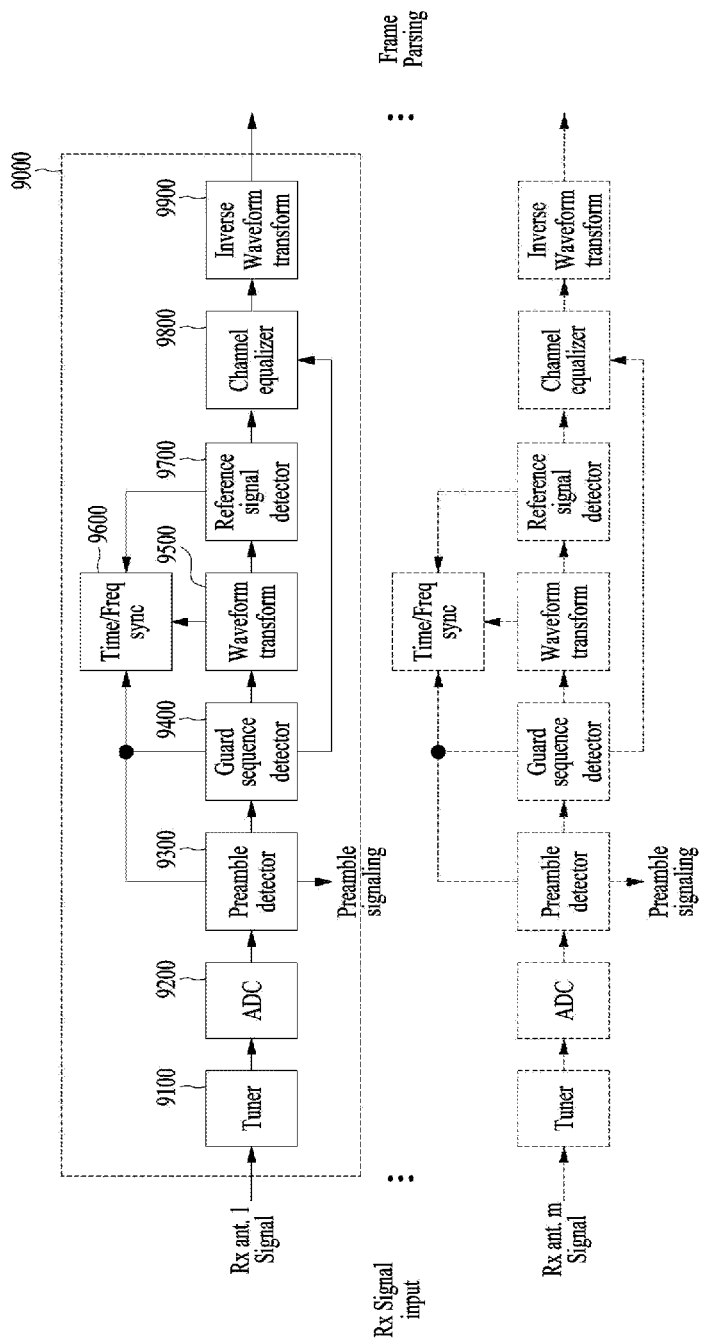
FIG. 9 illustrates a synchronization & demodulation module according to an embodiment of the present invention.

FIG. 9 illustrates a synchronization & demodulation module according to an embodiment of the present invention.

The synchronization & demodulation module shown in FIG. 9 corresponds to an embodiment of the synchronization & demodulation module described with reference to FIG. 8. The synchronization & demodulation module shown in FIG. 9 can perform a reverse operation of the operation of the waveform generation module illustrated in FIG. 7.

As shown in FIG. 9, the synchronization & demodulation module according to an embodiment of the present invention corresponds to a synchronization & demodulation module of an apparatus for receiving broadcast signals using m Rx antennas and can include m processing blocks for demodulating signals respectively input through m paths. The m processing blocks can perform the same processing procedure. A description will be given of operation of the first processing block 9000 from among the m processing blocks.

The first processing block 9000 can include a tuner 9100, an ADC block 9200, a preamble detector 9300, a guard sequence detector 9400, a waveform transform block 9500, a time/frequency synchronization block 9600, a reference signal detector 9700, a channel equalizer 9800 and an inverse waveform transform block 9900.

The tuner 9100 can select a desired frequency band, compensate for the magnitude of a received signal and output the compensated signal to the ADC block 9200.

The ADC block 9200 can convert the signal output from the tuner 9100 into a digital signal.

The preamble detector 9300 can detect a preamble (or preamble signal or preamble symbol) in order to check whether or not the digital signal is a signal of the system corresponding to the apparatus for receiving broadcast signals. In this case, the preamble detector 9300 can decode basic transmission parameters received through the preamble.

The guard sequence detector 9400 can detect a guard sequence in the digital signal. The time/frequency synchronization block 9600 can perform time/frequency synchronization using the detected guard sequence and the channel equalizer 9800 can estimate a channel through a received/restored sequence using the detected guard sequence.

The waveform transform block 9500 can perform a reverse operation of inverse waveform transform when the apparatus for transmitting broadcast signals has performed inverse waveform transform. When the broadcast transmission/reception system according to one embodiment of the present invention is a multi-carrier system, the waveform transform block 9500 can perform FFT. Furthermore, when the broadcast transmission/reception system according to an embodiment of the present invention is a single carrier system, the waveform transform block 9500 may not be used if a received time domain signal is processed in the frequency domain or processed in the time domain.

The time/frequency synchronization block 9600 can receive output data of the preamble detector 9300, guard sequence detector 9400 and reference signal detector 9700 and perform time synchronization and carrier frequency synchronization including guard sequence detection and block window positioning on a detected signal. Here, the time/frequency synchronization block 9600 can feed back the output signal of the waveform transform block 9500 for frequency synchronization.

The reference signal detector 9700 can detect a received reference signal. Accordingly, the apparatus for receiving broadcast signals according to an embodiment of the present invention can perform synchronization or channel estimation.

The channel equalizer 9800 can estimate a transmission channel from each Tx antenna to each Rx antenna from the guard sequence or reference signal and perform channel equalization for received data using the estimated channel.

The inverse waveform transform block 9900 may restore the original received data domain when the waveform transform block 9500 performs waveform transform for efficient synchronization and channel estimation/equalization. If the broadcast transmission/reception system according to an embodiment of the present invention is a single carrier system, the waveform transform block 9500 can perform FFT in order to carry out synchronization/channel estimation/equalization in the frequency domain and the inverse waveform transform block 9900 can perform IFFT on the channel-equalized signal to restore transmitted data symbols. If the broadcast transmission/reception system according to an embodiment of the present invention is a multi-carrier system, the inverse waveform transform block 9900 may not be used.

The above-described blocks may be omitted or replaced by blocks having similar or identical functions according to design.

Figure 10:
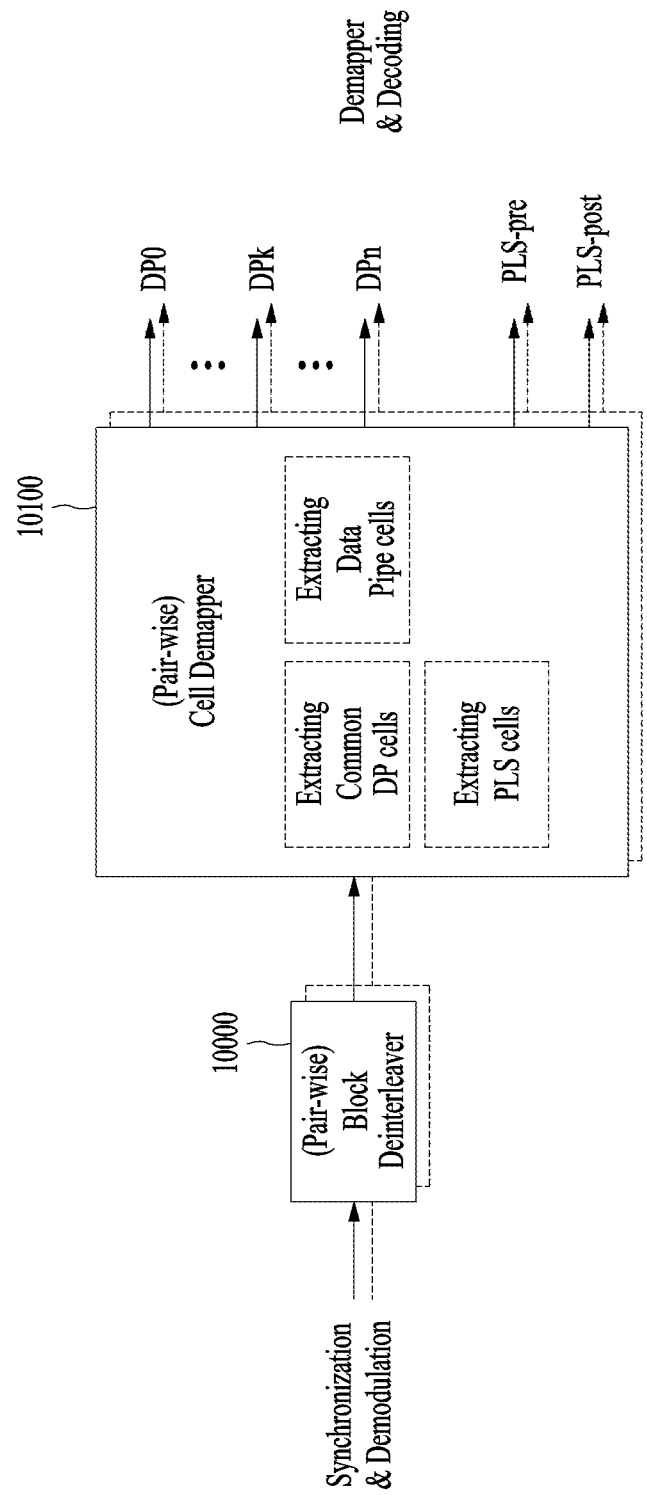
FIG. 10 illustrates a frame parsing module according to an embodiment of the present invention.

FIG. 10 illustrates a frame parsing module according to an embodiment of the present invention.

The frame parsing module illustrated in FIG. 10 corresponds to an embodiment of the frame parsing module described with reference to FIG. 8. The frame parsing module shown in FIG. 10 can perform a reverse operation of the operation of the frame structure module illustrated in FIG. 6.

As shown in FIG. 10, the frame parsing module according to an embodiment of the present invention can include at least one block deinterleaver 10000 and at least one cell demapper 10100.

The block deinterleaver 10000 can deinterleave data input through data paths of the m Rx antennas and processed by the synchronization & demodulation module on a signal block basis. In this case, if the apparatus for transmitting broadcast signals performs pair-wise interleaving as illustrated in FIG. 8, the block deinterleaver 10000 can process two consecutive pieces of data as a pair for each input path. Accordingly, the block interleaver 10000 can output two consecutive pieces of data even when deinterleaving has been performed. Furthermore, the block deinterleaver 10000 can perform a reverse operation of the interleaving operation performed by the apparatus for transmitting broadcast signals to output data in the original order.

The cell demapper 10100 can extract cells corresponding to common data, cells corresponding to data pipes and cells corresponding to PLS data from received signal frames. The cell demapper 10100 can merge data distributed and transmitted and output the same as a stream as necessary. When two consecutive pieces of cell input data are processed as a pair and mapped in the apparatus for transmitting broadcast signals, as shown in FIG. 6, the cell demapper 10100 can perform pair-wise cell demapping for processing two consecutive input cells as one unit as a reverse procedure of the mapping operation of the apparatus for transmitting broadcast signals.

In addition, the cell demapper 10100 can extract PLS signaling data received through the current frame as PLS-pre & PLS-post data and output the PLS-pre & PLS-post data.

The above-described blocks may be omitted or replaced by blocks having similar or identical functions according to design.

Figure 11:
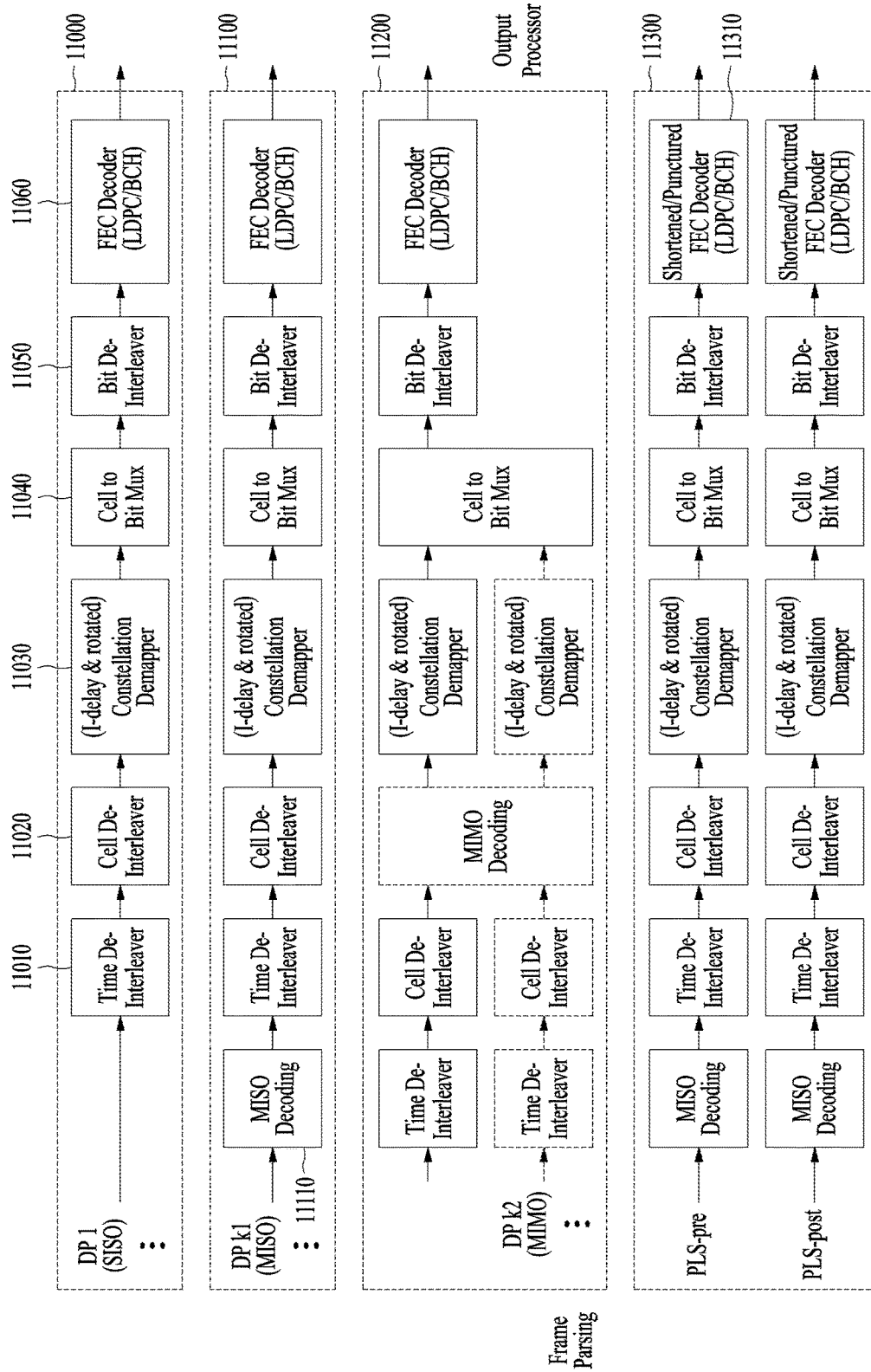
FIG. 11 illustrates a demapping & decoding module according to an embodiment of the present invention.

FIG. 11 illustrates a demapping & decoding module according to an embodiment of the present invention.

The demapping & decoding module shown in FIG. 11 corresponds to an embodiment of the demapping & decoding module illustrated in FIG. 8. The demapping & decoding module shown in FIG. 11 can perform a reverse operation of the operation of the coding & modulation module illustrated in FIG. 5.

The coding & modulation module of the apparatus for transmitting broadcast signals according to an embodiment of the present invention can process input data pipes by independently applying SISO, MISO and MIMO thereto for respective paths, as described above. Accordingly, the demapping & decoding module illustrated in FIG. 11 can include blocks for processing data output from the frame parsing module according to SISO, MISO and MIMO in response to the apparatus for transmitting broadcast signals.

As shown in FIG. 11, the demapping & decoding module according to an embodiment of the present invention can include a first block 11000 for SISO, a second block 11100 for MISO, a third block 11200 for MIMO and a fourth block 11300 for processing the PLS-pre/PLS-post information. The demapping & decoding module shown in FIG. 11 is exemplary and may include only the first block 11000 and the fourth block 11300, only the second block 11100 and the fourth block 11300 or only the third block 11200 and the fourth block 11300 according to design. That is, the demapping & decoding module can include blocks for processing data pipes equally or differently according to design.

A description will be given of each block of the demapping & decoding module.

The first block 11000 processes an input data pipe according to SISO and can include a time deinterleaver block 11010, a cell deinterleaver block 11020, a constellation demapper block 11030, a cell-to-bit mux block 11040, a bit deinterleaver block 11050 and an FEC decoder block 11060.

The time deinterleaver block 11010 can perform a reverse process of the process performed by the time interleaver block 5060 illustrated in FIG. 5. That is, the time deinterleaver block 11010 can deinterleave input symbols interleaved in the time domain into original positions thereof The cell deinterleaver block 11020 can perform a reverse process of the process performed by the cell interleaver block 5050 illustrated in FIG. 5. That is, the cell deinterleaver block 11020 can deinterleave positions of cells spread in one FEC block into original positions thereof The constellation demapper block 11030 can perform a reverse process of the process performed by the constellation mapper block 5040 illustrated in FIG. 5. That is, the constellation demapper block 11030 can demap a symbol domain input signal to bit domain data. In addition, the constellation demapper block 11030 may perform hard decision and output decided bit data. Furthermore, the constellation demapper block 11030 may output a log-likelihood ratio (LLR) of each bit, which corresponds to a soft decision value or probability value. If the apparatus for transmitting broadcast signals applies a rotated constellation in order to obtain additional diversity gain, the constellation demapper block 11030 can perform 2-dimensional LLR demapping corresponding to the rotated constellation. Here, the constellation demapper block 11030 can calculate the LLR such that a delay applied by the apparatus for transmitting broadcast signals to the I or Q component can be compensated.

The cell-to-bit mux block 11040 can perform a reverse process of the process performed by the bit-to-cell demux block 5030 illustrated in FIG. 5. That is, the cell-to-bit mux block 11040 can restore bit data mapped by the bit-to-cell demux block 5030 to the original bit streams.

The bit deinterleaver block 11050 can perform a reverse process of the process performed by the bit interleaver 5020 illustrated in FIG. 5. That is, the bit deinterleaver block 11050 can deinterleave the bit streams output from the cell-to-bit mux block 11040 in the original order.

The FEC decoder block 11060 can perform a reverse process of the process performed by the FEC encoder block 5010 illustrated in FIG. 5. That is, the FEC decoder block 11060 can correct an error generated on a transmission channel by performing LDPC decoding and BCH decoding.

The second block 11100 processes an input data pipe according to MISO and can include the time deinterleaver block, cell deinterleaver block, constellation demapper block, cell-to-bit mux block, bit deinterleaver block and FEC decoder block in the same manner as the first block 11000, as shown in FIG. 11. However, the second block 11100 is distinguished from the first block 11000 in that the second block 11100 further includes a MISO decoding block 11110. The second block 11100 performs the same procedure including time deinterleaving operation to outputting operation as the first block 11000 and thus description of the corresponding blocks is omitted.

The MISO decoding block 11110 can perform a reverse operation of the operation of the MISO processing block 5110 illustrated in FIG. 5. If the broadcast transmission/reception system according to an embodiment of the present invention uses STBC, the MISO decoding block 11110 can perform Alamouti decoding.

The third block 11200 processes an input data pipe according to MIMO and can include the time deinterleaver block, cell deinterleaver block, constellation demapper block, cell-to-bit mux block, bit deinterleaver block and FEC decoder block in the same manner as the second block 11100, as shown in FIG. 11. However, the third block 11200 is distinguished from the second block 11100 in that the third block 11200 further includes a MIMO decoding block 11210. The basic roles of the time deinterleaver block, cell deinterleaver block, constellation demapper block, cell-to-bit mux block and bit deinterleaver block included in the third block 11200 are identical to those of the corresponding blocks included in the first and second blocks 11000 and 11100 although functions thereof may be different from the first and second blocks 11000 and 11100.

The MIMO decoding block 11210 can receive output data of the cell deinterleaver for input signals of the m Rx antennas and perform MIMO decoding as a reverse operation of the operation of the MIMO processing block 5220 illustrated in FIG. 5. The MIMO decoding block 11210 can perform maximum likelihood decoding to obtain optimal decoding performance or carry out sphere decoding with reduced complexity. Otherwise, the MIMO decoding block 11210 can achieve improved decoding performance by performing MMSE detection or carrying out iterative decoding with MMSE detection.

The fourth block 11300 processes the PLS-pre/PLS-post information and can perform SISO or MISO decoding. The fourth block 11300 can carry out a reverse process of the process performed by the fourth block 5300 described with reference to FIG. 5.

The basic roles of the time deinterleaver block, cell deinterleaver block, constellation demapper block, cell-to-bit mux block and bit deinterleaver block included in the fourth block 11300 are identical to those of the corresponding blocks of the first, second and third blocks 11000, 11100 and 11200 although functions thereof may be different from the first, second and third blocks 11000, 11100 and 11200.

The shortened/punctured FEC decoder 11310 included in the fourth block 11300 can perform a reverse process of the process performed by the shortened/punctured FEC encoder block 5310 described with reference to FIG. 5. That is, the shortened/punctured FEC decoder 11310 can perform de-shortening and de-puncturing on data shortened/punctured according to PLS data length and then carry out FEC decoding thereon. In this case, the FEC decoder used for data pipes can also be used for PLS. Accordingly, additional FEC decoder hardware for the PLS only is not needed and thus system design is simplified and efficient coding is achieved.

The above-described blocks may be omitted or replaced by blocks having similar or identical functions according to design.

The demapping & decoding module according to an embodiment of the present invention can output data pipes and PLS information processed for the respective paths to the output processor, as illustrated in FIG. 11.

Figure 12:
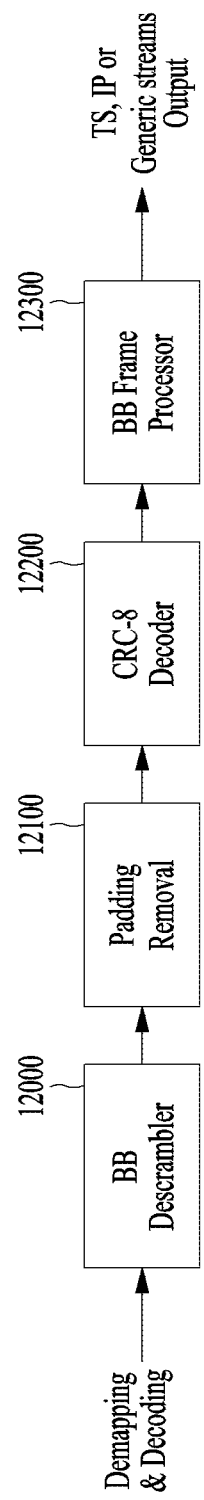
FIG. 12 illustrates an output processor according to an embodiment of the present invention.
Figure 13:
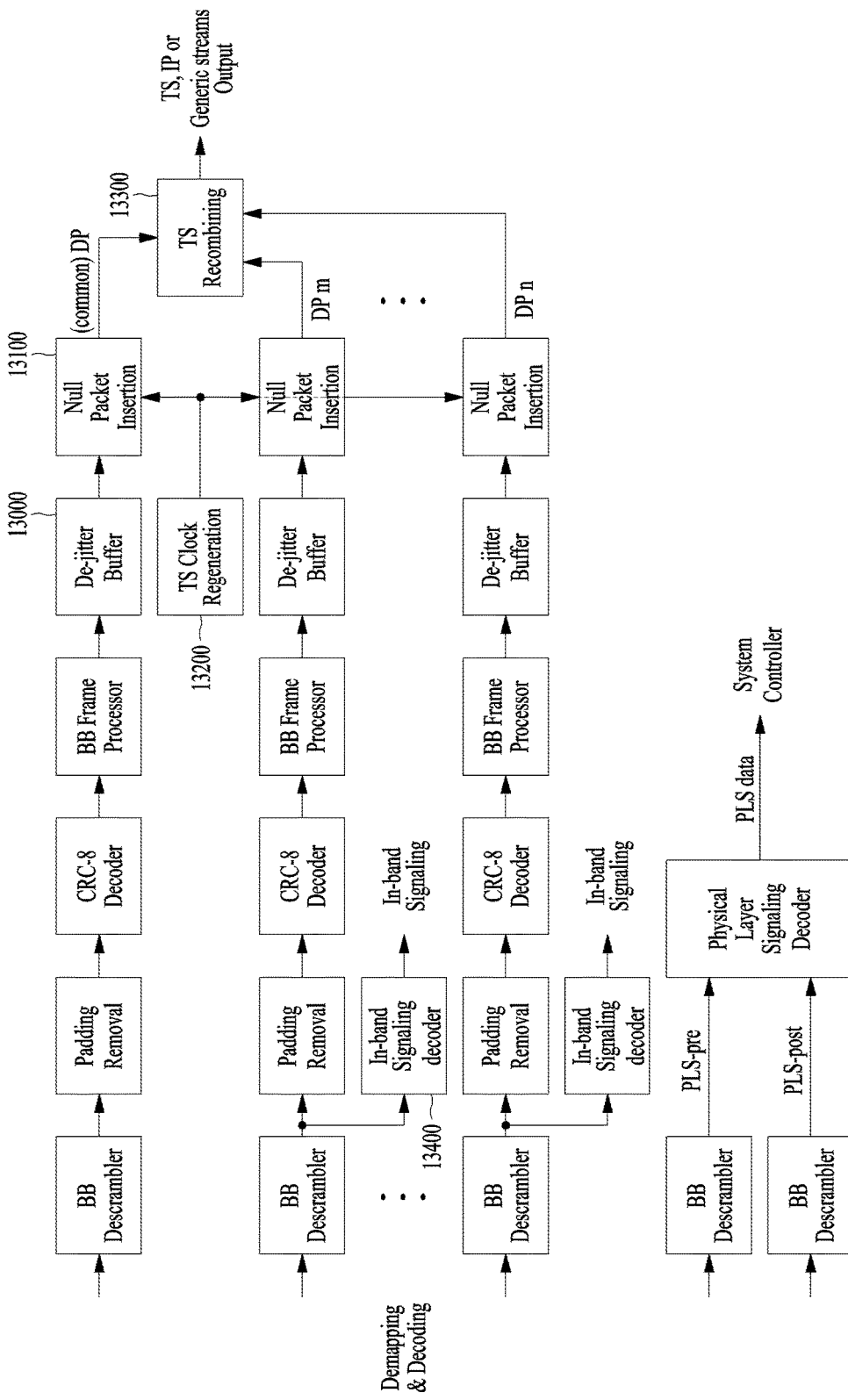
FIG. 13 illustrates an output processor according to another embodiment of the present invention.

FIGS. 12 and 13 illustrate output processors according to embodiments of the present invention.

FIG. 12 illustrates an output processor according to an embodiment of the present invention.

The output processor illustrated in FIG. 12 corresponds to an embodiment of the output processor illustrated in FIG. 8. The output processor illustrated in FIG. 12 receives a single data pipe output from the demapping & decoding module and outputs a single output stream. The output processor can perform a reverse operation of the operation of the input formatting module illustrated in FIG. 2.

The output processor shown in FIG. 12 can include a BB scrambler block 12000, a padding removal block 12100, a CRC-8 decoder block 12200 and a BB frame processor block 12300.

The BB scrambler block 12000 can descramble an input bit stream by generating the same PRBS as that used in the apparatus for transmitting broadcast signals for the input bit stream and carrying out an XOR operation on the PRBS and the bit stream.

The padding removal block 12100 can remove padding bits inserted by the apparatus for transmitting broadcast signals as necessary.

The CRC-8 decoder block 12200 can check a block error by performing CRC decoding on the bit stream received from the padding removal block 12100.

The BB frame processor block 12300 can decode information transmitted through a BB frame header and restore MPEG-TSs, IP streams (v4 or v6) or generic streams using the decoded information.

The above-described blocks may be omitted or replaced by blocks having similar or identical functions according to design.

FIG. 13 illustrates an output processor according to another embodiment of the present invention.

The output processor shown in FIG. 13 corresponds to an embodiment of the output processor illustrated in FIG. 8. The output processor shown in FIG. 13 receives multiple data pipes output from the demapping & decoding module. Decoding multiple data pipes can include a process of merging common data commonly applicable to a plurality of data pipes and data pipes related thereto and decoding the same or a process of simultaneously decoding a plurality of services or service components (including a scalable video service) by the apparatus for receiving broadcast signals.

The output processor shown in FIG. 13 can include a BB descrambler block, a padding removal block, a CRC-8 decoder block and a BB frame processor block as the output processor illustrated in FIG. 12. The basic roles of these blocks correspond to those of the blocks described with reference to FIG. 12 although operations thereof may differ from those of the blocks illustrated in FIG. 12.

A de-jitter buffer block 13000 included in the output processor shown in FIG. 13 can compensate for a delay, inserted by the apparatus for transmitting broadcast signals for synchronization of multiple data pipes, according to a restored TTO (time to output) parameter.

A null packet insertion block 13100 can restore a null packet removed from a stream with reference to a restored DNP (deleted null packet) and output common data.

A TS clock regeneration block 13200 can restore time synchronization of output packets based on ISCR (input stream time reference) information.

A TS recombining block 13300 can recombine the common data and data pipes related thereto, output from the null packet insertion block 13100, to restore the original MPEG-TSs, IP streams (v4 or v6) or generic streams. The TTO, DNT and ISCR information can be obtained through the BB frame header.

An in-band signaling decoding block 13400 can decode and output in-band physical layer signaling information transmitted through a padding bit field in each FEC frame of a data pipe.

The output processor shown in FIG. 13 can BB-descramble the PLS-pre information and PLS-post information respectively input through a PLS-pre path and a PLS-post path and decode the descrambled data to restore the original PLS data. The restored PLS data is delivered to a system controller included in the apparatus for receiving broadcast signals. The system controller can provide parameters necessary for the synchronization & demodulation module, frame parsing module, demapping & decoding module and output processor module of the apparatus for receiving broadcast signals.

The above-described blocks may be omitted or replaced by blocks having similar r identical functions according to design.

Figure 14:
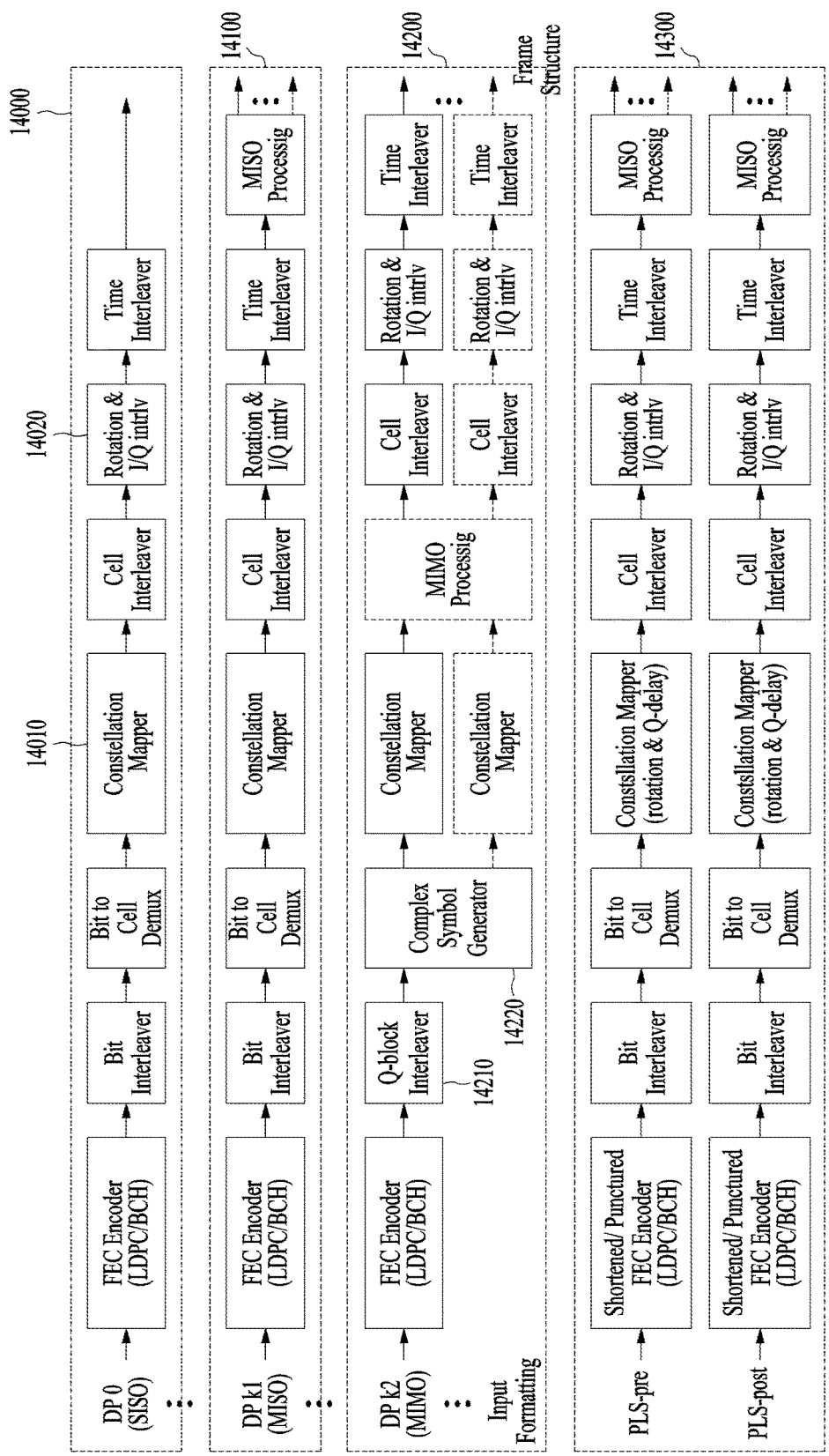
FIG. 14 illustrates a coding & modulation module according to another embodiment of the present invention.

FIG. 14 illustrates a coding & modulation module according to another embodiment of the present invention.

The coding & modulation module shown in FIG. 14 corresponds to another embodiment of the coding & modulation module illustrated in FIGS. 1 to 5.

To control QoS for each service or service component transmitted through each data pipe, as described above with reference to FIG. 5, the coding & modulation module shown in FIG. 14 can include a first block 14000 for SISO, a second block 14100 for MISO, a third block 14200 for MIMO and a fourth block 14300 for processing the PLS-pre/PLS-post information. In addition, the coding & modulation module can include blocks for processing data pipes equally or differently according to the design. The first to fourth blocks 14000 to 14300 shown in FIG. 14 are similar to the first to fourth blocks 5000 to 5300 illustrated in FIG. 5.

However, the first to fourth blocks 14000 to 14300 shown in FIG. 14 are distinguished from the first to fourth blocks 5000 to 5300 illustrated in FIG. 5 in that a constellation mapper 14010 included in the first to fourth blocks 14000 to 14300 has a function different from the first to fourth blocks 5000 to 5300 illustrated in FIG. 5, a rotation & I/Q interleaver block 14020 is present between the cell interleaver and the time interleaver of the first to fourth blocks 14000 to 14300 illustrated in FIG. 14 and the third block 14200 for MIMO has a configuration different from the third block 5200 for MIMO illustrated in FIG. 5. The following description focuses on these differences between the first to fourth blocks 14000 to 14300 shown in FIG. 14 and the first to fourth blocks 5000 to 5300 illustrated in FIG. 5.

The constellation mapper block 14010 shown in FIG. 14 can map an input bit word to a complex symbol. However, the constellation mapper block 14010 may not perform constellation rotation, differently from the constellation mapper block shown in FIG. 5. The constellation mapper block 14010 shown in FIG. 14 is commonly applicable to the first, second and third blocks 14000, 14100 and 14200, as described above.

The rotation & I/Q interleaver block 14020 can independently interleave in-phase and quadrature-phase components of each complex symbol of cell-interleaved data output from the cell interleaver and output the in-phase and quadrature-phase components on a symbol-by-symbol basis. The number of number of input data pieces and output data pieces of the rotation & I/Q interleaver block 14020 is two or more which can be changed by the designer. In addition, the rotation & I/Q interleaver block 14020 may not interleave the in-phase component.

The rotation & I/Q interleaver block 14020 is commonly applicable to the first to fourth blocks 14000 to 14300, as described above. In this case, whether or not the rotation & I/Q interleaver block 14020 is applied to the fourth block 14300 for processing the PLS-pre/post information can be signaled through the above-described preamble.

The third block 14200 for MIMO can include a Q-block interleaver block 14210 and a complex symbol generator block 14220, as illustrated in FIG. 14.

The Q-block interleaver block 14210 can permute a parity part of an FEC-encoded FEC block received from the FEC encoder. Accordingly, a parity part of an LDPC H matrix can be made into a cyclic structure like an information part. The Q-block interleaver block 14210 can permute the order of output bit blocks having Q size of the LDPC H matrix and then perform row-column block interleaving to generate final bit streams.

The complex symbol generator block 14220 receives the bit streams output from the Q-block interleaver block 14210, maps the bit streams to complex symbols and outputs the complex symbols. In this case, the complex symbol generator block 14220 can output the complex symbols through at least two paths. This can be modified by the designer.

The above-described blocks may be omitted or replaced by blocks having similar or identical functions according to design.

The coding & modulation module according to another embodiment of the present invention, illustrated in FIG. 14, can output data pipes, PLS-pre information and PLS-post information processed for respective paths to the frame structure module.

Figure 15:
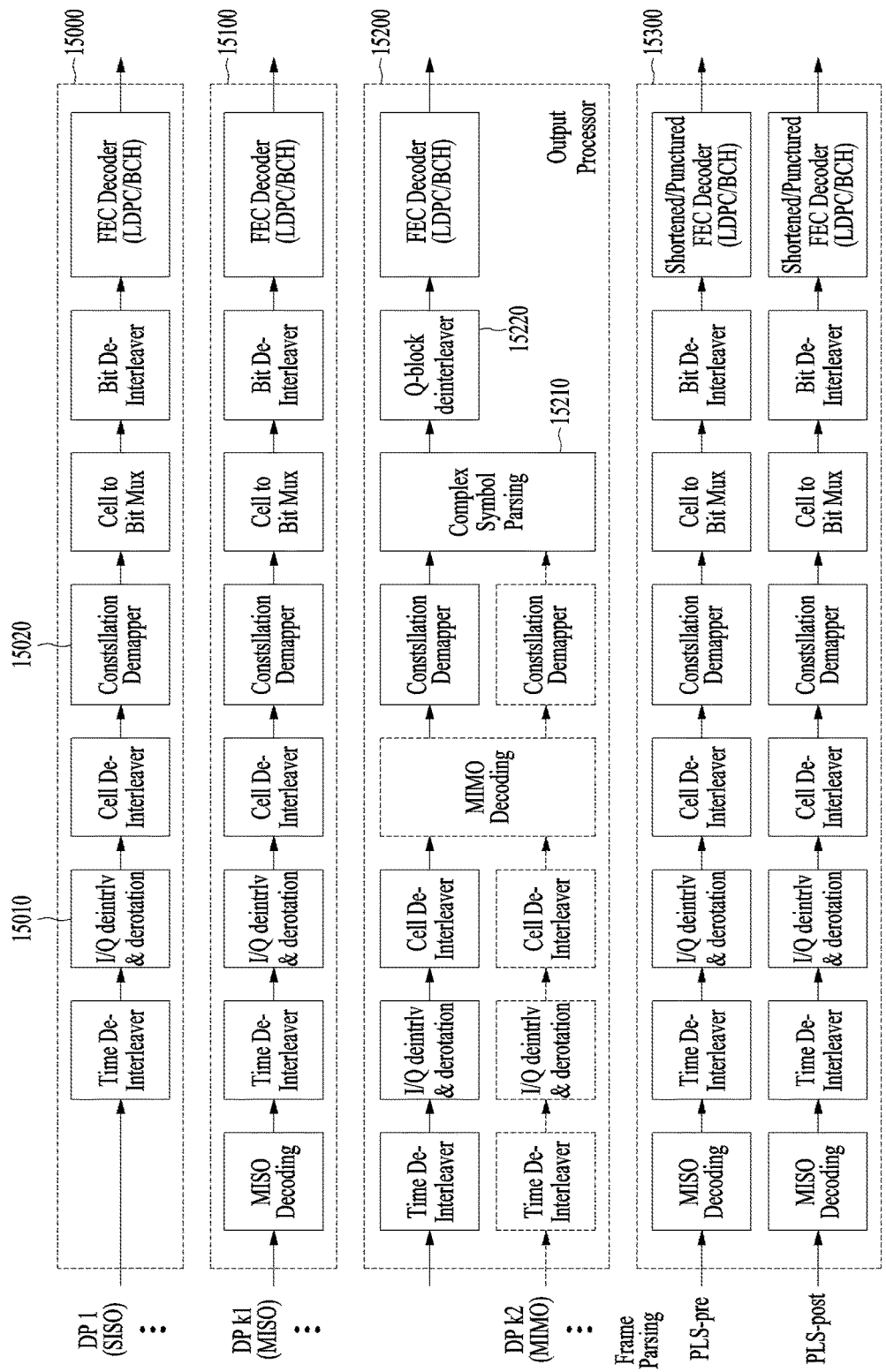
FIG. 15 illustrates a demapping & decoding module according to another embodiment of the present invention.

FIG. 15 illustrates a demapping & decoding module according to another embodiment of the present invention.

The demapping & decoding module shown in FIG. 15 corresponds to another embodiment of the demapping & decoding module illustrated in FIG. 11. The demapping & decoding module shown in FIG. 15 can perform a reverse operation of the operation of the coding & modulation module illustrated in FIG. 14.

As shown in FIG. 15, the demapping & decoding module according to another embodiment of the present invention can include a first block 15000 for SISO, a second block 11100 for MISO, a third block 15200 for MIMO and a fourth block 14300 for processing the PLS-pre/PLS-post information. In addition, the demapping & decoding module can include blocks for processing data pipes equally or differently according to design. The first to fourth blocks 15000 to 15300 shown in FIG. 15 are similar to the first to fourth blocks 11000 to 11300 illustrated in FIG. 11.

However, the first to fourth blocks 15000 to 15300 shown in FIG. 15 are distinguished from the first to fourth blocks 11000 to 11300 illustrated in FIG. 11 in that an I/Q deinterleaver and derotation block 15010 is present between the time interleaver and the cell deinterleaver of the first to fourth blocks 15000 to 15300, a constellation mapper 15010 included in the first to fourth blocks 15000 to 15300 has a function different from the first to fourth blocks 11000 to 11300 illustrated in FIG. 11 and the third block 15200 for MIMO has a configuration different from the third block 11200 for MIMO illustrated in FIG. 11. The following description focuses on these differences between the first to fourth blocks 15000 to 15300 shown in FIG. 15 and the first to fourth blocks 11000 to 11300 illustrated in FIG. 11.

The I/Q deinterleaver & derotation block 15010 can perform a reverse process of the process performed by the rotation & I/Q interleaver block 14020 illustrated in FIG. 14. That is, the I/Q deinterleaver & derotation block 15010 can deinterleave I and Q components I/Q-interleaved and transmitted by the apparatus for transmitting broadcast signals and derotate complex symbols having the restored I and Q components.

The I/Q deinterleaver & derotation block 15010 is commonly applicable to the first to fourth blocks 15000 to 15300, as described above. In this case, whether or not the I/Q deinterleaver & derotation block 15010 is applied to the fourth block 15300 for processing the PLS-pre/post information can be signaled through the above-described preamble.

The constellation demapper block 15020 can perform a reverse process of the process performed by the constellation mapper block 14010 illustrated in FIG. 14. That is, the constellation demapper block 15020 can demap cell-deinterleaved data without performing derotation.

The third block 15200 for MIMO can include a complex symbol parsing block 15210 and a Q-block deinterleaver block 15220, as shown in FIG. 15.

The complex symbol parsing block 15210 can perform a reverse process of the process performed by the complex symbol generator block 14220 illustrated in FIG. 14. That is, the complex symbol parsing block 15210 can parse complex data symbols and demap the same to bit data. In this case, the complex symbol parsing block 15210 can receive complex data symbols through at least two paths.

The Q-block deinterleaver block 15220 can perform a reverse process of the process carried out by the Q-block interleaver block 14210 illustrated in FIG. 14. That is, the Q-block deinterleaver block 15220 can restore Q size blocks according to row-column deinterleaving, restore the order of permuted blocks to the original order and then restore positions of parity bits to original positions according to parity deinterleaving.

The above-described blocks may be omitted or replaced by blocks having similar or identical functions according to design.

As illustrated in FIG. 15, the demapping & decoding module according to another embodiment of the present invention can output data pipes and PLS information processed for respective paths to the output processor.

Figure 16:
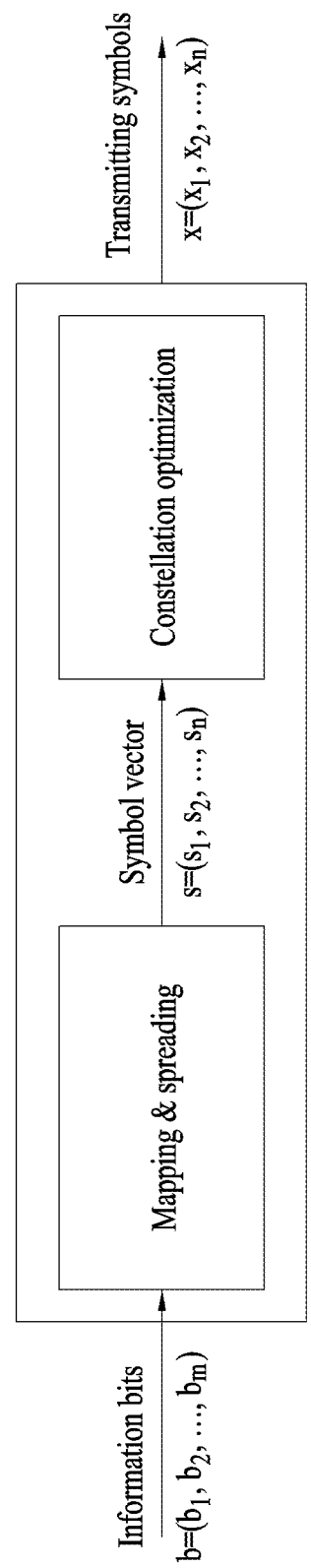
FIG. 16 illustrates a constellation mapper block according to another embodiment of the present invention.

FIG. 16 illustrates a constellation mapper block according to another embodiment of the present invention.

The constellation mapper block according to the other embodiment of the present invention may be a block corresponding to the constellation mapper block of the coding & modulation module described above. The constellation mapper block according to the other embodiment of the present invention may perform operations using multiple symbols to enhance SSD performance. These operations may be performed together with non-uniform QAM. The constellation mapper block according to the other embodiment of the present invention may include a mapping and spreading block and/or a constellation optimization block.

The mapping and spreading block may spread multiple symbols based on an encoding table. The mapping and spreading block may map received information bits to multiple spread symbols. In this way, the mapping and spreading block may independently divide real components and imaginary components in symbols. The mapping and spreading block may output a symbol vector to the constellation optimization block.

The constellation optimization block may adjust a distance between multiple received symbols. In this process, a constellation may be optimized such that a capacity is maximized. An additional signal space diversity gain may be obtained through this constellation optimization.

According to a given embodiment, the mapping and spreading block may correspond to the constellation mapper block, and the constellation optimization block may correspond to an SSD block. In this case, the mapping and spreading block may perform a spreading-mapping process on QAM, non-uniform QAM (NUQ), and non-uniform constellation (NUC). In this case, the constellation optimization block may perform a process of optimizing the mapped constellation.

Detailed operations of the respective blocks will be described below.

Figure 17:
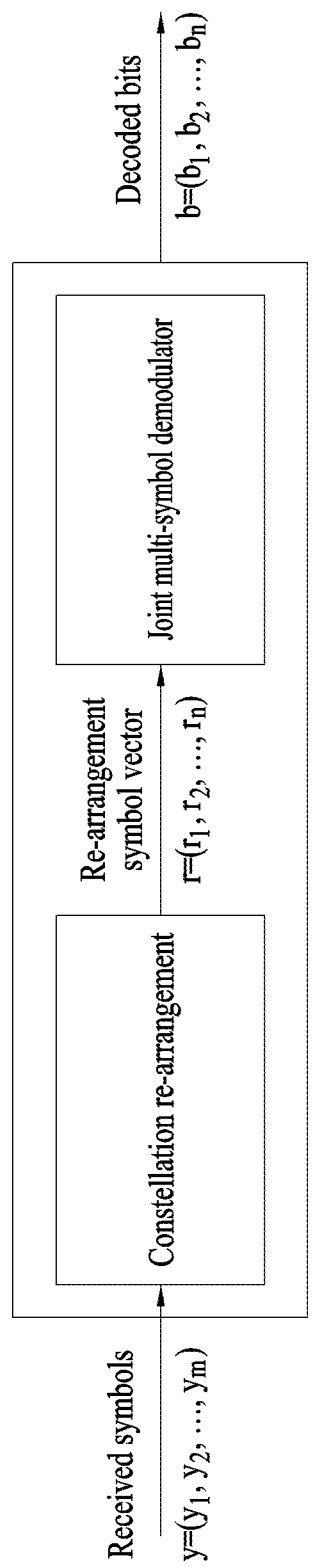
FIG. 17 illustrates a constellation demapper block according to another embodiment of the present invention.

FIG. 17 illustrates a constellation demapper block according to another embodiment of the present invention.

The constellation demapper block according to the other embodiment of the present invention may be a block at a receiving side corresponding to the constellation demapper block of the demapping & decoding module described above. The constellation demapper block according to the other embodiment of the present invention may be a block corresponding to the constellation mapper block according to the other embodiment of the present invention. The constellation demapper block according to the other embodiment of the present invention may include a constellation rearrangement block and/or a joint multi-symbol demodulator.

The constellation rearrangement block may perform an operation for independently dividing real components and imaginary components of multiple received symbols. The constellation rearrangement block may perform an operation of rearranging constellations of received symbols. The constellation rearrangement block may output rearranged symbol vectors to the joint multi-symbol demodulator.

The joint multi-symbol demodulator may perform joint LM detection to obtain diversity gain between multiple symbols. In this way, decoded bits (or LLR values of bits) may be output.

According to a given embodiment, the constellation rearrangement block may correspond to the SSD block. The SSD block at the receiving end may perform SSD decoding. According to a given embodiment, the joint multi-symbol demodulator may correspond to the constellation demapper block. In this case, the joint multi-symbol demodulator may perform constellation demapping from rearranged constellations.

Detailed operations of the respective blocks will be described below.

Figure 18:
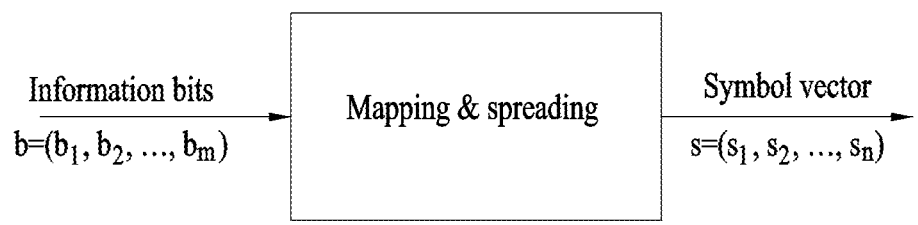
FIG. 18 illustrates a mapping and spreading block of a constellation mapper block according to another embodiment of the present invention.

FIG. 18 illustrates a mapping and spreading block of the constellation mapper block according to another embodiment of the present invention.

As described in the foregoing, the mapping and spreading block may spread multiple symbols, and map bits to the multiple spread symbols. In description below, a case in which 4 QAM is spread to 16 QAM to perform mapping will be given as an example. However, this is merely an example, and the present invention is not restricted to this example.

First, the multiple symbols may be spread based on the encoding table. The encoding table may be expressed as below.

TABLE 1

| (Input bits) | $S_1$ i-out | $S_1$ q-out | $S_2$ i-out | $S_2$ q-out |
|---|---|---|---|---|
| 0000 | −3 | −3 | 1 | 1 |
| 0001 | −3 | −1 | 1 | −3 |
| 0010 | −3 | 1 | 1 | 3 |
| 0011 | −3 | 3 | 1 | −1 |
| 0100 | −1 | −3 | −3 | 1 |
| 0101 | −1 | −1 | −3 | −3 |
| 0110 | −1 | 1 | −3 | 3 |
| 0111 | −1 | 3 | −3 | −1 |
| 1000 | 1 | −3 | 3 | 1 |

TABLE 1-continued

| (Input bits) | $S_1$ i-out | $S_1$ q-out | $S_2$ i-out | $S_2$ q-out |
|---|---|---|---|---|
| 1001 | 1 | −1 | 3 | −3 |
| 1010 | 1 | 1 | 3 | 3 |
| 1011 | 1 | 3 | 3 | −1 |
| 1100 | 3 | −3 | −1 | 1 |
| 1101 | 3 | −1 | −1 | −3 |
| 1110 | 3 | 1 | −1 | 3 |
| 1111 | 3 | 3 | −1 | −1 |

The above encoding table may be an encoding table corresponding to a case in which 4 QAM is spread to 16 QAM. When multiple symbols are spread based on the encoding table, multiple spread symbols may be obtained. The multiple spread symbols may be expressed by S1 and S2.

Thereafter, input bits may be mapped to the multiple spread symbols (S1, S2). In this instance, mapping may be performed based on the above-described encoding table. Labeling may not be restricted to the encoding table given as an example. In other words, a labeling value (mapping value) of the symbol S2 may be determined while maintaining gray labeling of the symbol S1. When the multiple symbols are spread, and the input bits are mapped to the multiple symbols, a structure of multiple combined symbols may be formed. The multiple combined symbols may be expressed by QM.

A size of a constellation may vary according to the number of multiple spread symbols or a spread size. For example, a constellation of 4 QAM may be spread to 16 QAM, 64 QAM or 256QAM. A symbol may refer to a symbol mapped to each point of a constellation.

FIG. 19 illustrates a constellation of multiple spread symbols and a constellation of rearranged multiple symbols according to an embodiment of the present invention.

FIG. 19(a) illustrates the constellation of multiple spread symbols according to the embodiment of the present invention. The left figure may correspond to a constellation of a symbol S1, and the right figure may correspond to a constellation of a symbol S2. Here, the constellation of the symbol S1 and the constellation of the symbol S2 may mean that a location of the symbol S1 and a location of the symbol S2 are shown in one constellation rather than meaning that two different constellations are present. Here, symbols positioned in the same figure may refer to multiple symbols combined by the above-described spreading-mapping process. For example, an inverted triangular symbol in the constellation of the symbol S1 may be combined with an inverted triangular symbol in the constellation of the symbol S2 to establish a multi-symbol relation. In addition, according to an example of the encoding table described above, input bits "0000" may be mapped to these symbols.

FIG. 19(b) illustrates the constellation of multiple rearranged symbols according to the embodiment of the present invention. The constellation illustrated in FIG. 19(a) may be rearranged to a constellation as shown in FIG. 19(b) through a rearrangment process at the receiving end. As in FIG. 19(b), the rearranged constellation may have a form obtained by rotation of a constellation (4 QAM) before spreading at a transmitting end. The rearrangment process will be described below. Here, symbols positioned in the same figure may indicate mapping locations of symbols combined before being spread.

In other words, a constellation of multiple rearranged symbols may have a form obtained by rotation of a constellation before spreading. This may have the same effect as in a case in which symbols are rotated and spread through a rotated constellation technique (ROT) and a Q delay interleaver, and then the symbols rotated before being spread are formed through Q delay interleaving at the receiving end according to the existing SSD scheme.

Therefore, according to the scheme proposed in the present invention, the Q delay interleaver is not needed to spread a constellation.

Figure 20:
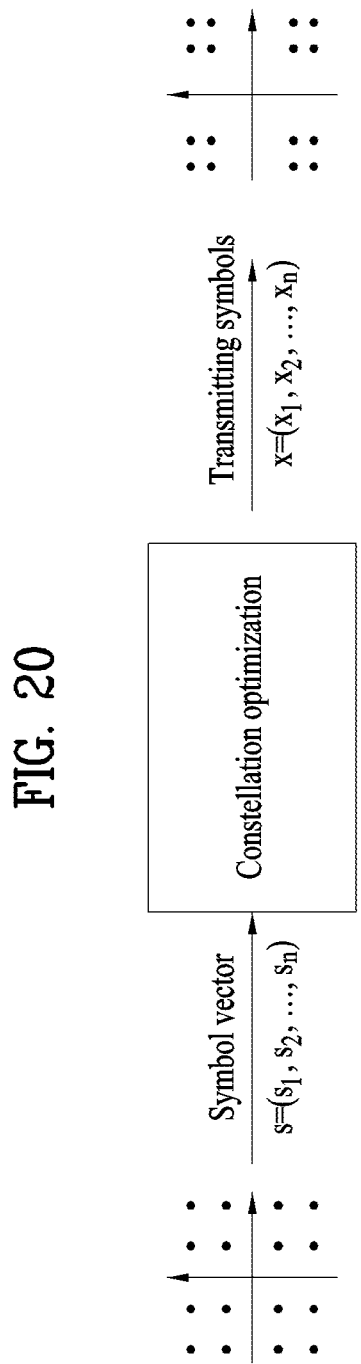
FIG. 20 illustrates a constellation optimization block of a constellation mapper block according to another embodiment of the present invention.

FIG. 20 illustrates a constellation optimization block of a constellation mapper block according to another embodiment of the present invention.

As described in the foregoing, the constellation optimization block may adjust a distance between multiple received symbols. An adjustment process may be performed using the non-uniform QAM. It is possible to maximize diversity gain of multiple spread symbols through the adjustment process.

As described in the foregoing, the constellation optimization block may correspond to the SSD block. The SSD block at the transmitting end may perform SSD encoding since SSD gain may be obtained by operation of the constellation optimization block. According to a given embodiment, the constellation optimization block may operate by independently processing a real component (I component) and an imaginary component (Q component).

FIG. 21 illustrates a constellation optimization process and a rearranged constellation according to an embodiment of the present invention.

FIG. 21(*a*) illustrates the constellation optimization process according to the embodiment of the present invention. This embodiment illustrates a case in which 4 QAM is spread to 16 QAM. The spread constellation may be divided into sub-constellations. A distance d between respective constellations may be adjusted in each of the sub-constellations. A constellation of symbols spread through this adjustment process may have a form of non-uniform QAM. According to a given embodiment, a constellation of spread symbols may have a form of general QAM or NUC. According to a given embodiment, a constellation of spread symbols may correspond to non-uniform 64 QAM (NUQ-64) in non-uniform QAM.

FIG. 21(*b*) illustrates the rearranged constellation according to the embodiment of the present invention. A constellation optimized through a process of FIG. 21(*a*) may be rearranged to a constellation as in FIG. 21(*b*) through a rearrangement process at the receiving end. As illustrated in FIG. 21(*b*), the rearranged constellation may have a form obtained by rotation of a constellation (4 QAM) before spreading at the transmitting end. The rearrangement process will be described below. Here, a rotation angle of the constellation may be determined based on a distance factor d. A relation between the distance factor d and the rotation angle may be expressed as below.

$$\theta = \tan^{-1}(d + P_1) + \frac{\pi}{4}$$ [Equation 1]

The above equation may be an example of a relational expression in 4 QAM.

The distance factor d between constellations may be set to a value optimized through capacity analysis. In other words, the constellation optimization block may optimize constellations by determining a distance factor d through capacity analysis, and a value θ of a rotation angle after rearrangement may be determined by the determined distance factor d.

Figure 22:
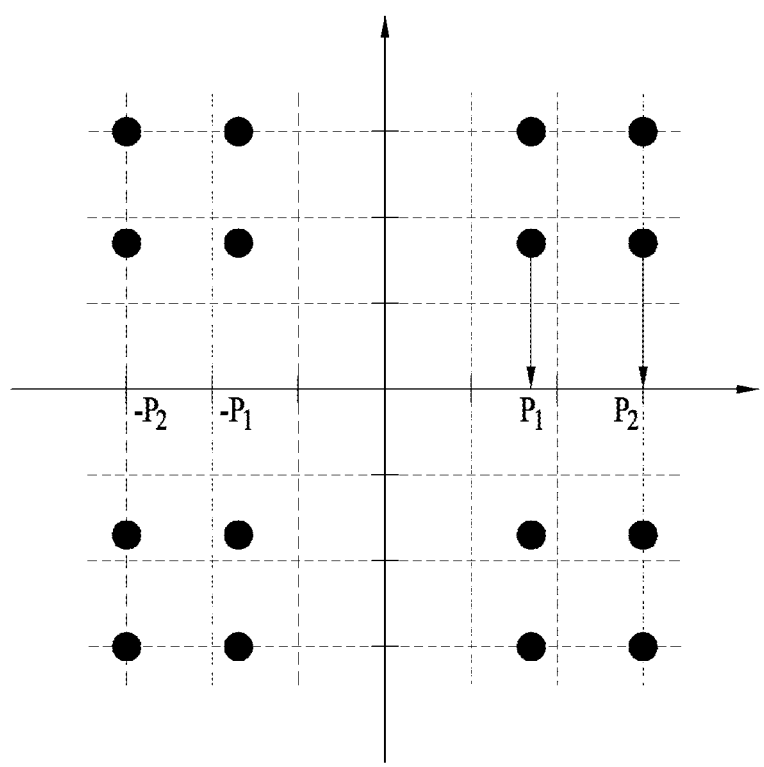
FIG. 22 illustrates spread non-uniform 16 QAM according to an embodiment of the present invention.

FIG. 22 illustrates spread non-uniform 16 QAM according to an embodiment of the present invention.

This figure may illustrate a result obtained by applying the above-described spreading & mapping and constellation optimization processes to 4 QAM. A distance between symbols in a constellation may be a relative value. Thus, when $P_1=\sqrt{3}$ and $P_2=3$, a distance factor d may correspond to $d=1-\sqrt{3}$. In this case, a value of a rotation angle after rearrangement may be expressed by θ=15° through the above-described equation.

In other words, a rearranged constellation may be in a state of being rotated by 15°, and thus have the same effect as in a case in which a constellation (4 QAM) before spreading is rotated. Therefore, an effect of the conventional art may be obtained without the Q delay interleaver.

FIG. 23 illustrates a constellation optimization process and a rearranged constellation according to another embodiment of the present invention.

FIG. 23(*a*) illustrates the constellation optimization process according to the other embodiment of the present invention. This embodiment shows a case in which 16 QAM is spread to 256 QAM. As described in the foregoing, each spread constellation may be divided into sub-constellations. Distances between respective constellations (d1, d2) may be adjusted in each of the sub-constellations. A constellation of symbols spread through this adjustment process may have a form of non-uniform QAM.

As modulation order increases, the number of distance factors in a sub-constellation may increase. It can be understood that the number of distance factors is two (d1, d2) in the present embodiment, which means that more variables need to be optimized.

When variables increase, an SSD technique using the existing ROT may have a decreased degree of freedom in an optimization process. According to the present invention, variables may be optimized through capacity analysis. Therefore, optimized variable values may be more efficiently obtained.

FIG. 23(*b*) illustrates the rearranged constellation according to the other embodiment of the present invention. When the constellation of FIG. 23(*a*) is rearranged at the receiving end, a form as in FIG. 23(*b*) may be obtained. A value θ of a rotation angle in the rearranged constellation may be determined based on values of the optimized distance factors d1 and d2 of FIG. 23(*a*).

PAM grid values of each constellation may be expressed by P1, . . . , P8 in FIG. 23(*a*). Here, values of P1, . . . , P8 may be expressed by $P_1, \ldots, P_8 = \{4-2\sqrt{3}, 2, 2\sqrt{3}, 4\sqrt{3}-2, 6, 4-2\sqrt{3}, 4\sqrt{3}-2, 6\sqrt{3}\}$. Therefore, values of d1 and d2 may be expressed by $d_1=2\sqrt{3}-2$ and $d_2=6\sqrt{3}-6$. In this case, a value of a rotation angle may be equal to θ=15°. In other words, the value may correspond to a form obtained when a constellation before spreading is rotated by 15°.

Figure 24:
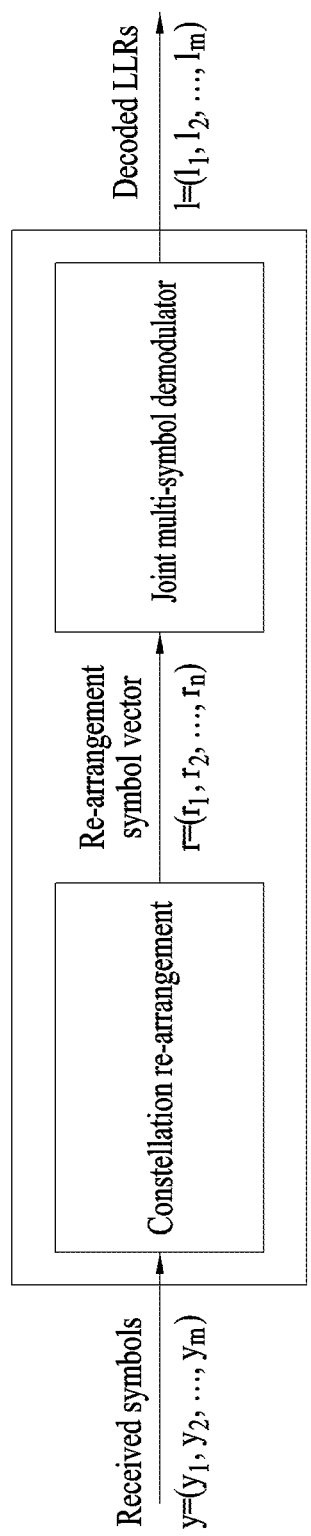
FIG. 24 illustrates a constellation demapper block according to another embodiment of the present invention.

FIG. 24 illustrates a constellation demapper block according to another embodiment of the present invention.

As described in the foregoing, the constellation demapper block according to the other embodiment of the present invention may include a constellation rearrangement block and/or a joint multi-symbol demodulator.

First, a description will be given of an operation of the constellation rearrangement block.

Multiple symbols Y received at the receiving end may be expressed as below.

$$y_1 = h_1 \cdot x_1 + n_1$$

$$y_2 = h_2 \cdot x_2 + n_2 \quad \text{[Equation 2]}$$

Only symbols y1 and y2 among the multiple symbols Y(y1, y2, . . . , yn) are expressed as an example. Symbols y1 and y2 may be rearranged through a constellation rearrangement process. Rearrangement may be performed using the following Equation.

$$r_1 = y_1^I + j \cdot y_2^I$$

$$r_2 = y_1^Q + j \cdot y_2^Q \quad \text{[Equation 3]}$$

In other words, the symbols may be rearranged to $r_1$ using a component I of $y_1$ ($y_1^I$) and a component I of $y_2$ ($y_2^I$). Similarly, the symbols may be rearranged to $r_2$ using a component Q of $y_1$ ($y_1^Q$) and a component Q of $y_2$ ($y_2^Q$). A constellation rearranged in this manner may have a form obtained by rotation of a constellation before spreading (e.g., 4 QAM) as described above.

A rearrangement process may correspond to a process in which multiple received symbols are rearranged only using I components of the multiple symbols or rearranged only using Q components of the multiple symbols. Rearranged symbols may correspond to symbols rearranged by separately collecting I components and Q components. Therefore, the rearrangement process according to the present invention may have an effect of separately encoding/interleaving I components and Q components at the transmitting end. In other words, since I components and Q components are separately collected and rearranged at the receiving end, there is an effect that components are independently encoded and transmitted without a process of independently encoding I components and Q components at the transmitting end.

In addition, according to the present invention, I and Q axes may be independently used without the Q delay interleaver unlike the conventional SSD scheme. In this way, additional diversity gain may be obtained.

According to an embodiment of the present invention, two I components ($y_1^I$, $y_2^I$) and two Q components ($y_1^Q$, $y_2^Q$) are collected and rearranged. However, a technical spirit of the present invention is not limited thereto, and three or more components may be collected and rearranged.

Here, when multiple combined symbols are presumed to experience different and independent channels, the above Equation showing the constellation rearrangement process may be expressed as below.

$$r_1 = \rho_1 x_1^I + j \cdot \rho_2 x_2^I + v_1$$

$$r_2 = \rho_1 x_1^Q + j \cdot \rho_2 x_2^Q + v_2 \quad \text{[Equation 4]}$$

Here, $\rho_1$, $\rho_2$ may correspond to fading amplitudes. Here, $v_1$, $v_2$ may correspond to complex Gaussian noises.

The presumption that multiple combined symbols experience different and independent channels may be effective without an additional configuration of the transmitting/receiving end. For example, when multiple symbols are disposed on different subcarriers not adjacent to each other in one OFDM symbol, the multiple symbols may experience different and independent channels. When multiple symbols are disposed on subcarriers of different OFDM symbols, the multiple symbols may similarly experience different and independent channels. Therefore, the above presumption may be effective.

As described in the foregoing, the constellation rearrangement block may correspond to the SSD block at the receiving end. The SSD block at the receiving end may perform SSD decoding since SSD gain may be obtained by an operation of the constellation rearrangement block. As described in the foregoing, the constellation rearrangement block may operate by independently processing a real component (I component) and an imaginary component (Q component).

Hereinafter, a description will be given of the joint multi-symbol demodulator.

The joint multi-symbol demodulator may perform joint ML demodulation on multiple rearranged symbols. Joint ML demodulation may be performed by the following Equation.

$$P(v^j = b \mid r) = \sum_{x_1 \in \chi} \sum_{x_2 \in \chi} \frac{1}{\sigma \sqrt{2\pi}} \cdot$$

$$\exp\left(-\frac{|r_1 - \rho_1 x_1^I + j \cdot \rho_2 x_2^I|^2 + |r_2 - \rho_1 x_1^Q + j \cdot \rho_2 x_2^Q|^2}{2\sigma^2}\right) \cdot P(x_1, x_2)$$

[Equation 5]

Here, b may satisfy an equation b={0, 1}. Here, i may satisfy an equation i={1, . . . , m}. Here, $\sigma^2$ may denote a noise variance. Here, P(x1, x2) may denote a priori probability of transmitting between x1 and x2.

LLR values of respective bits may be output from multiple rearranged symbols by an operation of the joint multi-symbol demodulator. According to a given embodiment, the output LLR values may be delivered as input values of an LDPC decoder.

Figure 25:
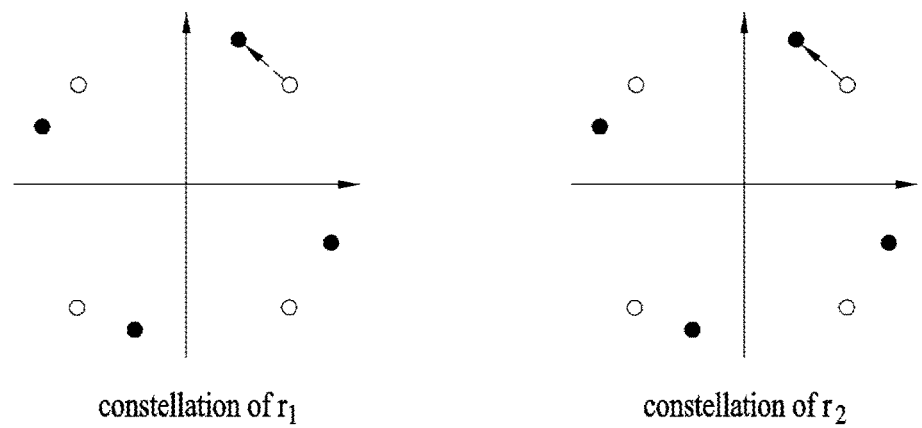
FIG. 25 illustrates constellations of rearranged multiple symbols according to an embodiment of the present invention.

FIG. 25 illustrates constellations of multiple rearranged symbols according to an embodiment of the present invention.

As described in the foregoing, multiple symbols undergoing a rearrangement process may have a form in which a constellation before spreading is rotated. As described in the foregoing, a rotation angle may be determined based on a distance factor d.

According to the present invention, SSD gain may be obtained using multiple symbols and non-uniform QAM without the Q delay interleaver.

In the present specification, a data pipe (DP) may be referred to as a physical layer pipe (PLP).

Figure 26:
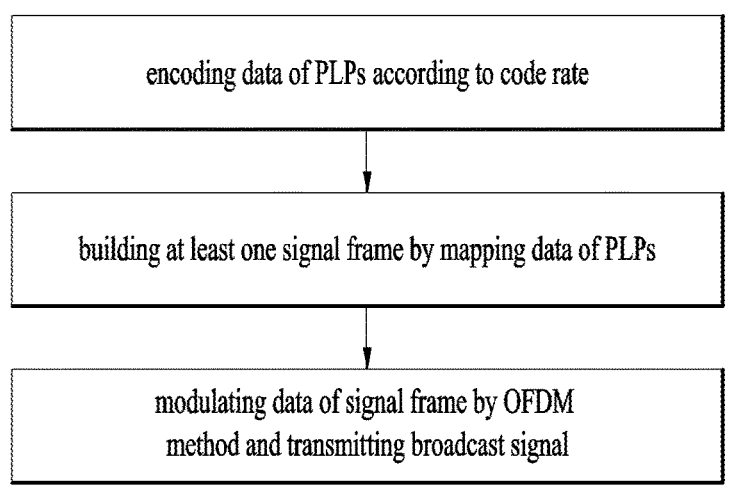
FIG. 26 illustrates a method of transmitting a broadcast signal according to an embodiment of the present invention.

FIG. 26 illustrates a method of transmitting a broadcast signal according to an embodiment of the present invention.

The method of transmitting the broadcast signal according to the embodiment of the present invention may include encoding data of a plurality of PLPs according to a code rate, generating at least one signal frame by mapping the data of the plurality of PLPs, and/or modulating data of the signal frame using an OFDM scheme and transmitting the broadcast signal.

The encoding of the data of the plurality of PLPs according to the code rate may include performing encoding as described above by the above-described coding & modulation module. The encoding may include performing LDPC encoding, performing bit interleaving, and/or mapping data to a constellation.

The performing of LDPC encoding may correspond to performing LDPC encoding as described above by the above-described FEC encoding block. LDPC encoding may be performed by an LDPC encoding block that does not perform BCH encoding. LDPC encoding may be performed according to a code rate as described above. LDPC encoding may be performed by data of at least one PLP among a plurality of PLPs.

The performing of bit interleaving may correspond to performing bit interleaving as described above by the above-described bit interleaver. Bit interleaving may be performed on LDPC-encoded data.

The mapping of data to the constellation may correspond to mapping bit-interleaved data to a constellation by the above-described constellation mapper block. Here, the constellation may correspond to one of QAM, NUQ, or NUC. A constellation among QAM, NUQ, and NUC to which data is mapped may be determined according to a PLP path.

The generating of the at least one signal frame by mapping the data of the plurality of PLPs may correspond to performing an operation of mapping an encoded PLP to generate signal frames by the above-described frame structure module.

The modulating of the data of the signal frame using the OFDM scheme and transmitting the broadcast signal may correspond to modulating data using the OFDM scheme by the above-described waveform generation module. As described in the foregoing, the waveform generation module may transmit data through a broadcast signal.

A method of transmitting a broadcast signal according to another embodiment of the present invention may be characterized in that NUQ corresponds to non-uniform 64 QAM (NUQ-64).

In a method of transmitting a broadcast signal according to another embodiment of the present invention, the encoding of the data of the plurality of PLPs described above may further include SSD encoding the data mapped to the constellation. SSD encoding may be performed using various schemes, and may be performed through the above-described constellation optimization process.

In a method of transmitting a broadcast signal according to another embodiment of the present invention, the mapping to the constellation may further include spreading symbols of the constellation, and mapping the bit-interleaved data to the spread symbols of the constellation. As described in the foregoing, the mapping and spreading block may spread symbols and map input data to the spread symbols. According to a given embodiment, only the mapping and spreading block may correspond to the constellation mapping block as described above.

In a method of transmitting a broadcast signal according to another embodiment of the present invention, the SSD encoding may include dividing the spread constellation into a plurality of sub-constellations, and/or optimizing the constellation by adjusting a distance between constellations in the sub-constellations. Here, SSD encoding may be performed by the above-described constellation optimization block. A constellation may be adjusted to NUQ, NUC, etc. by adjusting a distance between constellations. In this way, capacity analysis may be performed.

The above-described steps may be omitted or replaced by other steps having the same or similar functions.

Figure 27:
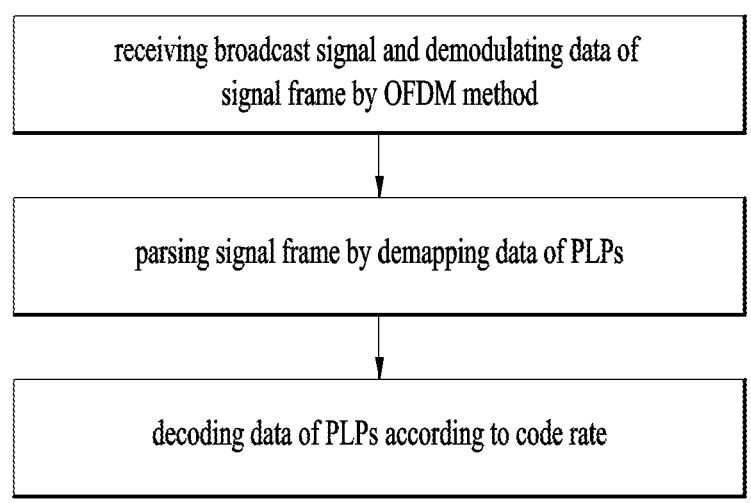
FIG. 27 illustrates a method of receiving a broadcast signal according to an embodiment of the present invention.

FIG. 27 illustrates a method of receiving a broadcast signal according to an embodiment of the present invention.

The method of receiving the broadcast signal according to the embodiment of the present invention may include receiving a broadcast signal and demodulating data of a signal frame using an OFDM scheme, demapping data of a plurality of PLPs to parse the signal frame, and/or decoding the data of the plurality of PLPs according to a code rate.

The receiving and demodulating may correspond to receiving and OFDM-demodulating the broadcast signal by the above-described synchronization & demodulation module.

The demapping of the data of the plurality of PLPs to parse the signal frame may correspond to parsing the signal frame by the above-described frame parsing module.

The decoding may correspond to decoding the data of the PLPs by the above-described decoding & demapping module. The decoding may include demapping data from a constellation, performing bit-interleaving, and/or performing LDPC decoding.

The demapping of the data from the constellation may correspond to demapping data of at least one PLP among the plurality of PLPs from the constellation by the above-described constellation demapper block. Here, the constellation may correspond to one of QAM, NUQ, or NUC.

The performing bit-interleaving may include bit-interleaving the data demapped from the constellation by the above-described bit interleaving block.

The performing of the LDPC decoding may include performing LDPC decoding according to code rate by the above-described LDPC decoding block.

In a method of receiving a broadcast signal according to another embodiment of the present invention, NUQ may correspond to NUQ-64.

In a method of receiving a broadcast signal according to another embodiment of the present invention, the decoding of the data of the plurality of PLPs may further include SSD decoding data of at least one PLP among a plurality of PLPs. SSD decoding may be performed using various schemes, and may be performed by the above-described constellation rearrangement process.

In a method of receiving a broadcast signal according to another embodiment of the present invention, the SSD decoding may further include rearranging a constellation to which data of at least one PLP among a plurality of PLPs is mapped. As described in the foregoing, the constellation rearrangement process may correspond to SSD decoding.

In a method of receiving a broadcast signal according to another embodiment of the present invention, the demapping of the data of the PLP from the constellation may further include demapping the data of the PLP from the rearranged constellation. The above-described joint multi-symbol demodulator may perform constellation demapping. According to a given embodiment, the joint multi-symbol demodulator may correspond to the constellation demapper block as described above.

In a method of receiving a broadcast signal according to another embodiment of the present invention, the rearrangement of the constellation may be characterized in that real components and imaginary components of symbols of the constellation are independently processed and rearranged. As described in the foregoing, the rearrangement of the constellation may include independently processing I and Q components.

The above-described steps can be omitted or replaced by steps executing similar or identical functions according to design.

Although the description of the present invention is explained with reference to each of the accompanying drawings for clarity, it is possible to design new embodiment(s) by merging the embodiments shown in the accompanying drawings with each other. And, if a recording medium readable by a computer, in which programs for executing the embodiments mentioned in the foregoing description are recorded, is designed in necessity of those skilled in the art, it may belong to the scope of the appended claims and their equivalents.

An apparatus and method according to the present invention may be non-limited by the configurations and methods of the embodiments mentioned in the foregoing description. And, the embodiments mentioned in the foregoing description can be configured in a manner of being selectively combined with one another entirely or in part to enable various modifications.

In addition, a method according to the present invention can be implemented with processor-readable codes in a processor-readable recording medium provided to a network device. The processor-readable medium may include all kinds of recording devices capable of storing data readable by a processor. The processor-readable medium may include one of ROM, RAM, CD-ROM, magnetic tapes, floppy discs, optical data storage devices, and the like for example and also include such a carrier-wave type implementation as a transmission via Internet. Furthermore, as the processor-readable recording medium is distributed to a computer system connected via network, processor-readable codes can be saved and executed according to a distributive system.

It will be appreciated by those skilled in the art that various modifications and variations can be made in the present invention without departing from the spirit or scope of the inventions. Thus, it is intended that the present invention covers the modifications and variations of this invention provided they come within the scope of the appended claims and their equivalents.

Both apparatus and method inventions are mentioned in this specification and descriptions of both of the apparatus and method inventions may be complementarily applicable to each other.

Details about modes for the present invention have been described in the above best mode.

INDUSTRIAL APPLICABILITY

As described above, the present invention can be wholly or partially applied to the apparatus for transmitting/receiving a digital broadcast signal and digital broadcast systems.

The invention claimed is:

1. A method of transmitting a broadcast signal, the method comprising:
   LDPC (Low Density Parity Check) encoding data of at least one of Physical Layer Pipes (PLPs) according to a code rate;
   bit interleaving the LDPC encoded data;
   mapping the bit interleaved data into a constellation, wherein the constellation includes a Non-Uniform Constellation (NUC), and wherein a real component and an imaginary component for the mapping are independently divided and separately mapped into at least two sub-constellations and the at least two sub-constellations form the NUC in which constellation points are non-uniformly spread;
   building at least one signal frame by mapping the mapped data of PLPs;
   modulating data of the built at least one signal frame by OFDM (Orthogonal Frequency Division Multiplexing); and
   transmitting the modulated data of the at least one signal frame.

2. The method of claim 1, wherein the NUC has a size of 16, 64 or 256 quadrature amplitude modulation (QAM).

3. A method of receiving a broadcast signal, the method comprising:
   receiving the broadcast signal;
   demodulating data of at least one signal frame in the received broadcast signal by OFDM (Orthogonal Frequency Division Multiplexing);
   parsing the at least one signal frame by demapping the data of Physical Layer Pipes (PLPs);
   demapping the data of at least one of the PLPs from a constellation, wherein the constellation includes a Non-Uniform Constellation (NUC) which is formed with at least two sub-constellations, and wherein a real component and an imaginary component of the data are separately demapped by using the at least two sub-constellations in which constellation points are non-uniformly spread;
   bit de-interleaving the data demapped from the constellation; and
   LDPC (Low Density Parity Check) decoding the bit de-interleaved data according to a code rate.

4. The method of claim 3, wherein the NUC has a size of 16, 64 or 256 quadrature amplitude modulation (QAM).

5. An apparatus of transmitting a broadcast signal, the apparatus comprising:
   an LDPC (Low Density Parity Check) encoding block configured to encode data of at least one of Physical Layer Pipes (PLPs) according to a code rate;
   a bit interleaving block configured to bit interleave the LDPC encoded data;
   a constellation mapping block configured to map the bit interleaved data into a constellation, wherein the constellation includes a Non-Uniform Constellation (NUC), and wherein a real component and an imaginary component for the mapping are independently divided and separately mapped into at least two sub-constellations and the at least two sub-constellations form the NUC in which constellation points are non-uniformly spread;
   a frame building module configured to build at least one signal frame by mapping the mapped data of PLPs; and
   an OFDM (Orthogonal Frequency Division Multiplexing) module configured to modulate data of the built at least one signal frame by OFDM and transmit the modulated data of the at least one signal frame.

6. The apparatus of claim 5, wherein the NUC has a size of 16, 64 or 256 quadrature amplitude modulation (QAM).

7. An apparatus of receiving a broadcast signal, the apparatus comprising:
   a receiver configured to receive the broadcast signal;
   an OFDM (Orthogonal Frequency Division Multiplexing) module configured to demodulate data of a signal frame in the received broadcast signal by OFDM;
   a parsing module configured to parse at least one signal frame by demapping the data of Physical Layer Pipes (PLPs);
   a demapping block configured to demap the data of at least one of the PLPs from a constellation, wherein the constellation includes a Non-Uniform Constellation (NUC) which is formed with at least two sub-constellations, and wherein a real component and an imaginary component of the data are separately demapped by using the at least two sub-constellations in which constellation points are non-uniformly spread;
   a bit de-interleaving block configured to bit de-interleave the data demapped from the constellation; and an LDPC (Low Density Parity Check) decoding block configured to LDPC decode the bit de-interleaved data according to a code rate.

8. The apparatus of claim 7, wherein the NUC has a size of 16, 64 or 256 quadrature amplitude modulation (QAM).

* * * * *